US010394398B2

(12) United States Patent
Hondo et al.

(10) Patent No.: US 10,394,398 B2
(45) Date of Patent: Aug. 27, 2019

(54) WIRING BODY, WIRING BOARD, WIRING STRUCTURE, AND TOUCH SENSOR

(71) Applicant: FUJIKURA LTD., Tokyo (JP)

(72) Inventors: Takaharu Hondo, Chiba (JP); Takeshi Shiojiri, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/508,839

(22) PCT Filed: Feb. 26, 2016

(86) PCT No.: PCT/JP2016/055893
§ 371 (c)(1),
(2) Date: Mar. 3, 2017

(87) PCT Pub. No.: WO2016/136964
PCT Pub. Date: Sep. 1, 2016

(65) Prior Publication Data
US 2017/0277306 A1    Sep. 28, 2017

(30) Foreign Application Priority Data

Feb. 27, 2015 (JP) ................................. 2015-038626
Feb. 27, 2015 (JP) ................................. 2015-038629

(51) Int. Cl.
*H05K 1/00*    (2006.01)
*G06F 3/044*    (2006.01)
(Continued)

(52) U.S. Cl.
CPC .............. *G06F 3/044* (2013.01); *G06F 3/041* (2013.01); *H01B 5/14* (2013.01); *H05K 1/02* (2013.01)

(58) Field of Classification Search
CPC ......... G06F 3/041; G06F 3/044; H05K 1/115; H01L 23/5389
(Continued)

(56) References Cited

U.S. PATENT DOCUMENTS 6,304,251 B1    10/2001    Ito et al.
9,122,088 B2    9/2015    Omote et al.
(Continued)

FOREIGN PATENT DOCUMENTS

CN    102455821 A    5/2012
CN    103384866 A    11/2013
(Continued)

OTHER PUBLICATIONS

Office Action issued in corresponding Taiwanese Application No. 105105822 dated Apr. 14, 2017 (5 pages).
(Continued)

*Primary Examiner* — Abdul-Samad A Adediran
(74) *Attorney, Agent, or Firm* — Osha Liang LLP

(57) ABSTRACT

A wiring body includes an adhesive layer, a first conductor layer disposed on the adhesive layer including a first terminal portion, a resin layer covering the first conductor layer except for at least the first terminal portion, and a second conductor layer disposed on the resin layer including a second terminal portion. The first terminal portion and the second terminal portion are shifted from each other along a thickness direction of the adhesive layer. The first terminal portion protrudes towards a side separated from the adhesive layer in the thickness direction. In a case where the first terminal portion is projected in a direction orthogonal to the thickness direction, at least a part of a projection portion of the first terminal portion overlaps with the resin layer.

15 Claims, 21 Drawing Sheets

(51) Int. Cl.
*G06F 3/041* (2006.01)
*H05K 1/02* (2006.01)
*H01B 5/14* (2006.01)

(58) Field of Classification Search
USPC .................. 324/649; 345/174; 361/783, 804; 439/76.2
See application file for complete search history.

(56) References Cited

U.S. PATENT DOCUMENTS

| | | |
|---|---|---|
| 2004/0209357 A1 | 10/2004 | Xia et al. |
| 2006/0223346 A1* | 10/2006 | Fujii ....................... G06F 3/041 439/76.2 |
| 2006/0228340 A1 | 10/2006 | Xia et al. |
| 2007/0182720 A1 | 8/2007 | Fujii et al. |
| 2009/0154132 A1* | 6/2009 | Okamoto ............ H01L 23/5389 361/804 |
| 2010/0128001 A1 | 5/2010 | Kimura et al. |
| 2010/0150883 A1 | 6/2010 | Xia et al. |
| 2010/0230154 A1 | 9/2010 | Naito et al. |
| 2011/0097308 A1 | 4/2011 | Xia et al. |
| 2012/0098551 A1 | 4/2012 | Tsukamoto |
| 2013/0093721 A1* | 4/2013 | Nakamura .............. G06F 3/044 345/174 |
| 2013/0251688 A1 | 9/2013 | Xia et al. |
| 2013/0307565 A1* | 11/2013 | Ra ........................... G06F 3/044 324/649 |
| 2014/0016048 A1 | 1/2014 | Omote et al. |
| 2014/0118832 A1 | 5/2014 | Gil et al. |
| 2014/0327842 A1 | 11/2014 | Tang et al. |
| 2016/0150642 A1* | 5/2016 | Kajita .................... H05K 1/115 361/783 |
| 2016/0331785 A1 | 11/2016 | Xia et al. |

FOREIGN PATENT DOCUMENTS

| | | |
|---|---|---|
| EP | 2765490 A1 | 8/2014 |
| JP | 2587975 B2 | 3/1997 |
| JP | 2000/020226 A | 1/2000 |
| JP | 2002/229736 A | 8/2002 |
| JP | 2009/032923 A | 2/2009 |
| JP | 2009/199249 A | 9/2009 |
| JP | 2010-146418 A | 7/2010 |
| JP | 2012/088934 A | 5/2012 |
| JP | 2012/138017 A | 7/2012 |
| JP | 2012/150580 A | 8/2012 |
| JP | 2012/194610 A | 10/2012 |
| JP | 2013-149215 A | 8/2013 |
| JP | 2014/106664 A | 6/2014 |
| JP | 3191884 U | 7/2014 |
| TW | 200949645 A | 12/2009 |
| TW | 201248801 A | 12/2012 |
| WO | 2012/132846 A1 | 10/2012 |

OTHER PUBLICATIONS

Office Action issued in corresponding Japanese Application No. 2015-038626 dated Jan. 5, 2016 (4 pages).
Office Action issued in corresponding Japanese Application No. 2015-038629 dated Dec. 28, 2015 (8 pages).
Office Action in corresponding Chinese Patent Application No. 201680002505.9 dated Oct. 17, 2017 (10 pages).
Extended European Search Report in counterpart European Application No. 16 75 5708.1 dated Jan. 30, 2018 (11 pages).
Office Action in corresponding European Patent Application No. 16 755 708.1, dated Oct. 30, 2018 (8 pages).
Summons to attend oral proceedings pursuant to Rule 115(1) EPC issued in corresponding European Patent Application No. 16755708.1 dated Jun. 14, 2019 (9 pages).

* cited by examiner

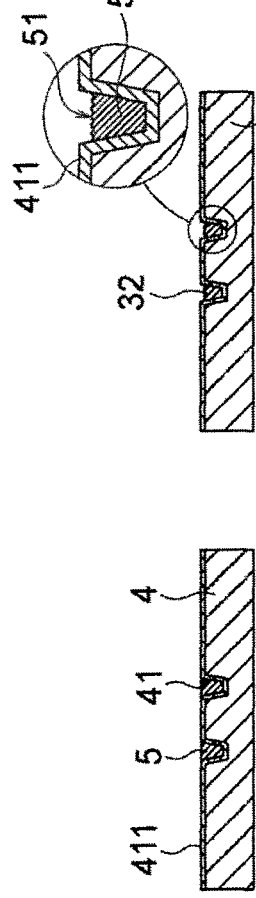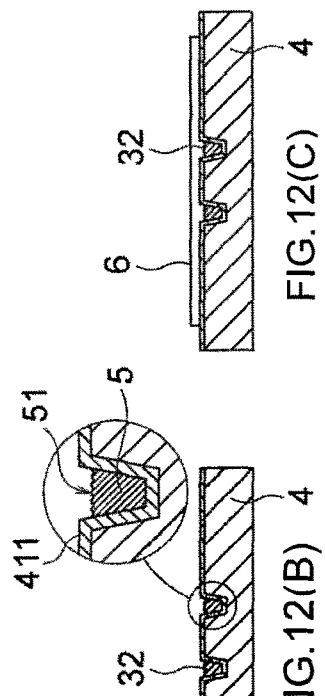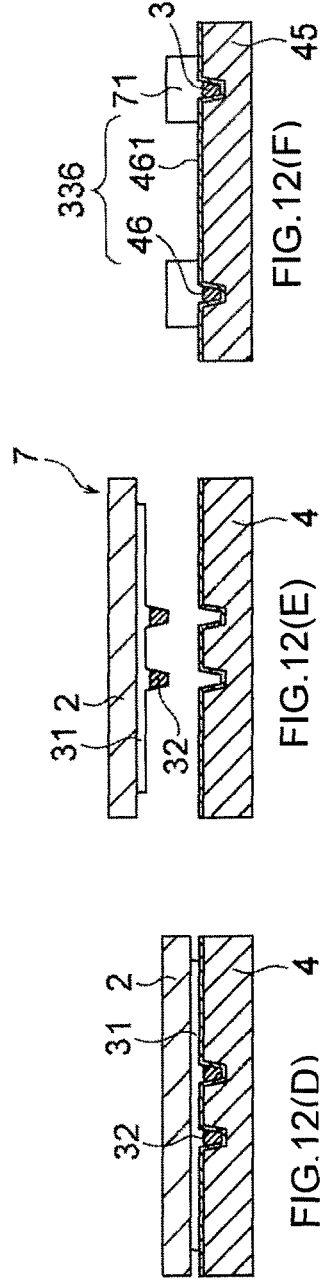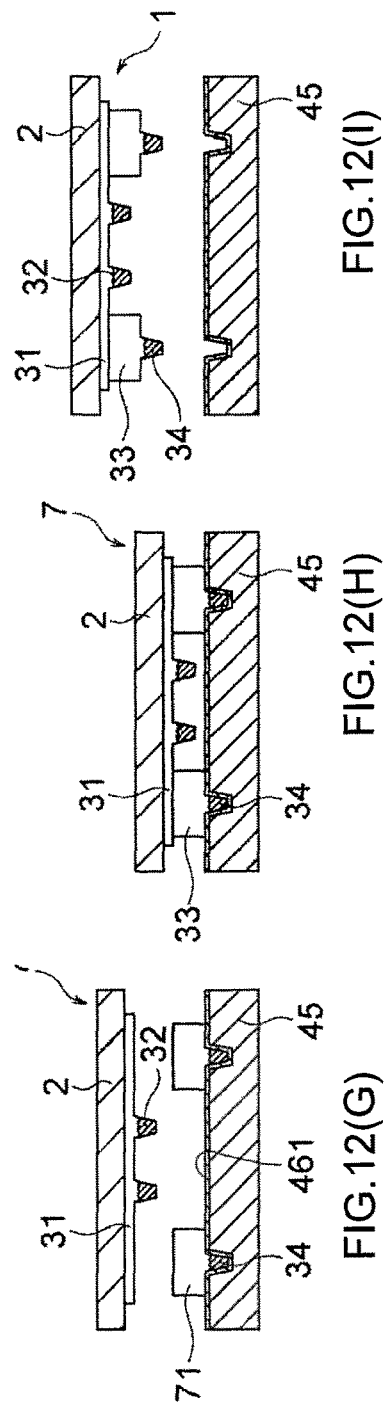

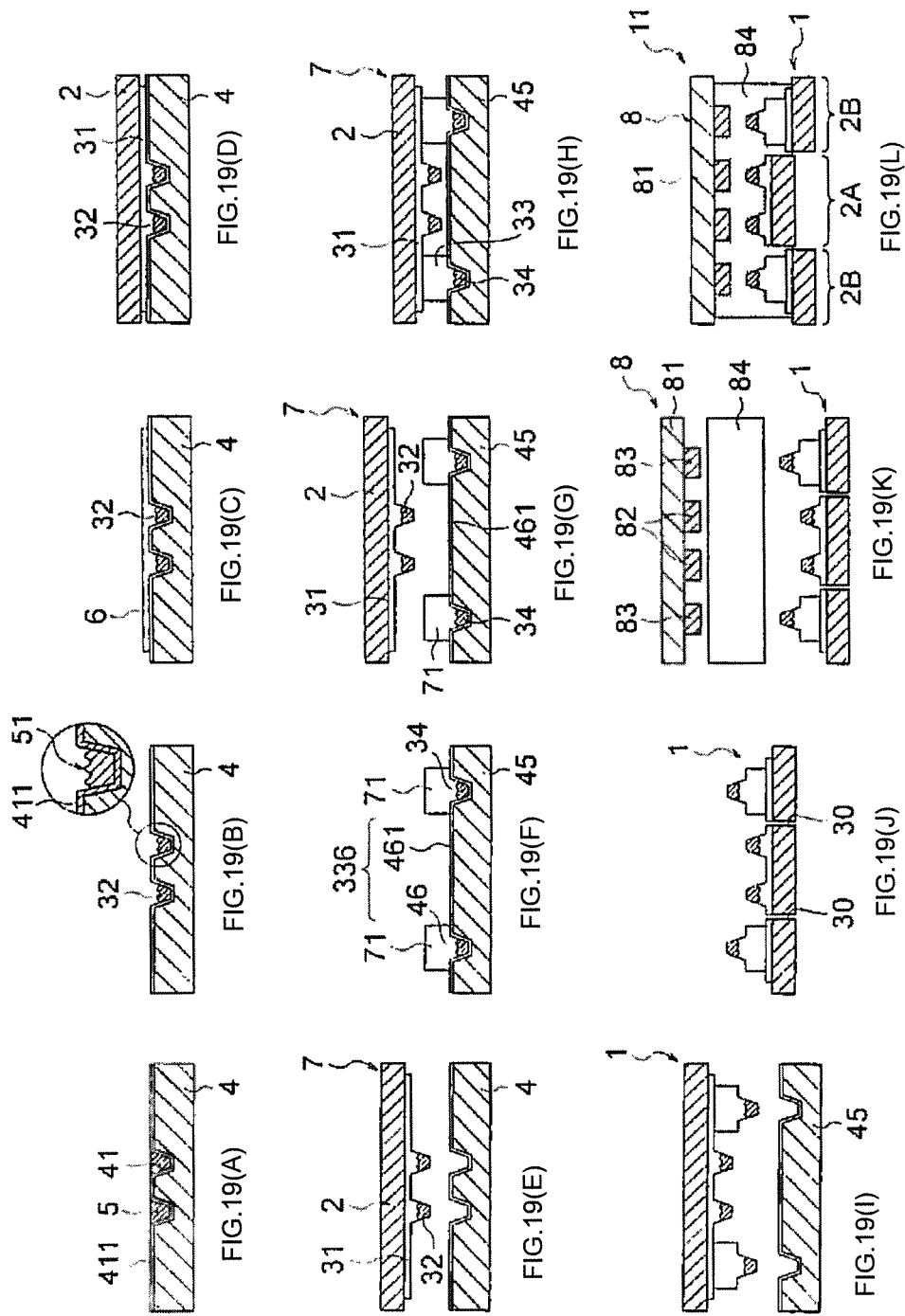

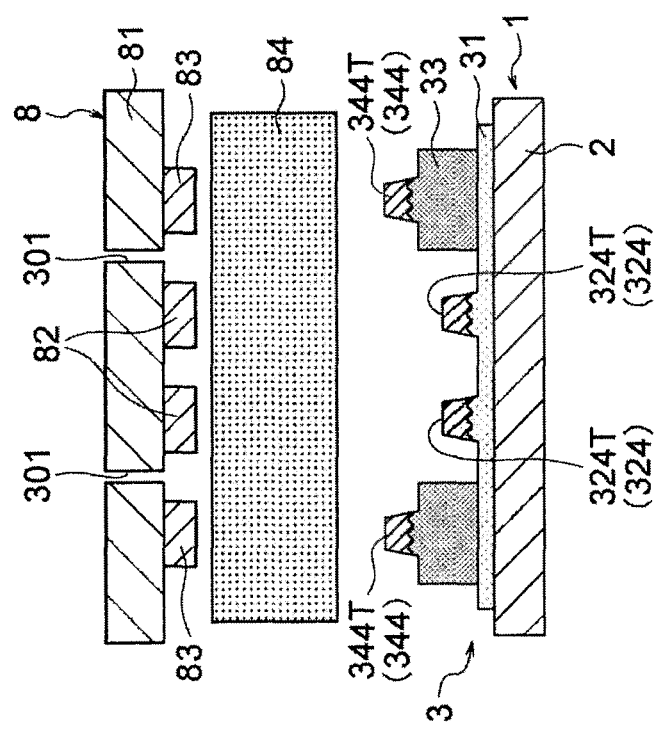
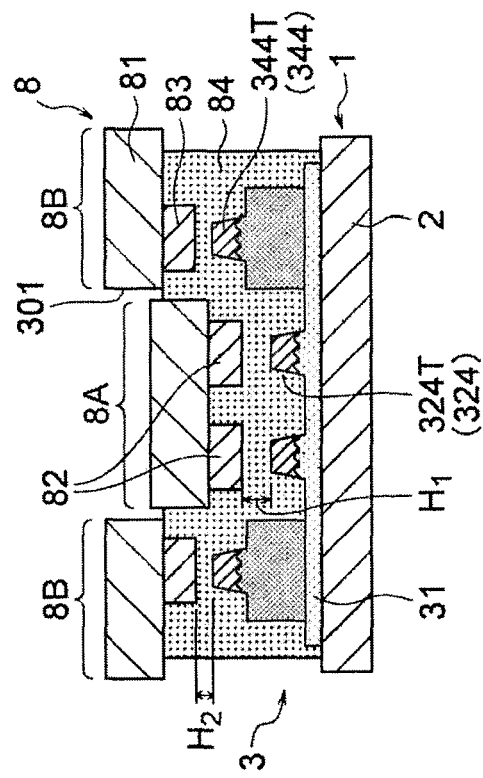
FIG. 20(A)
FIG. 20(B)

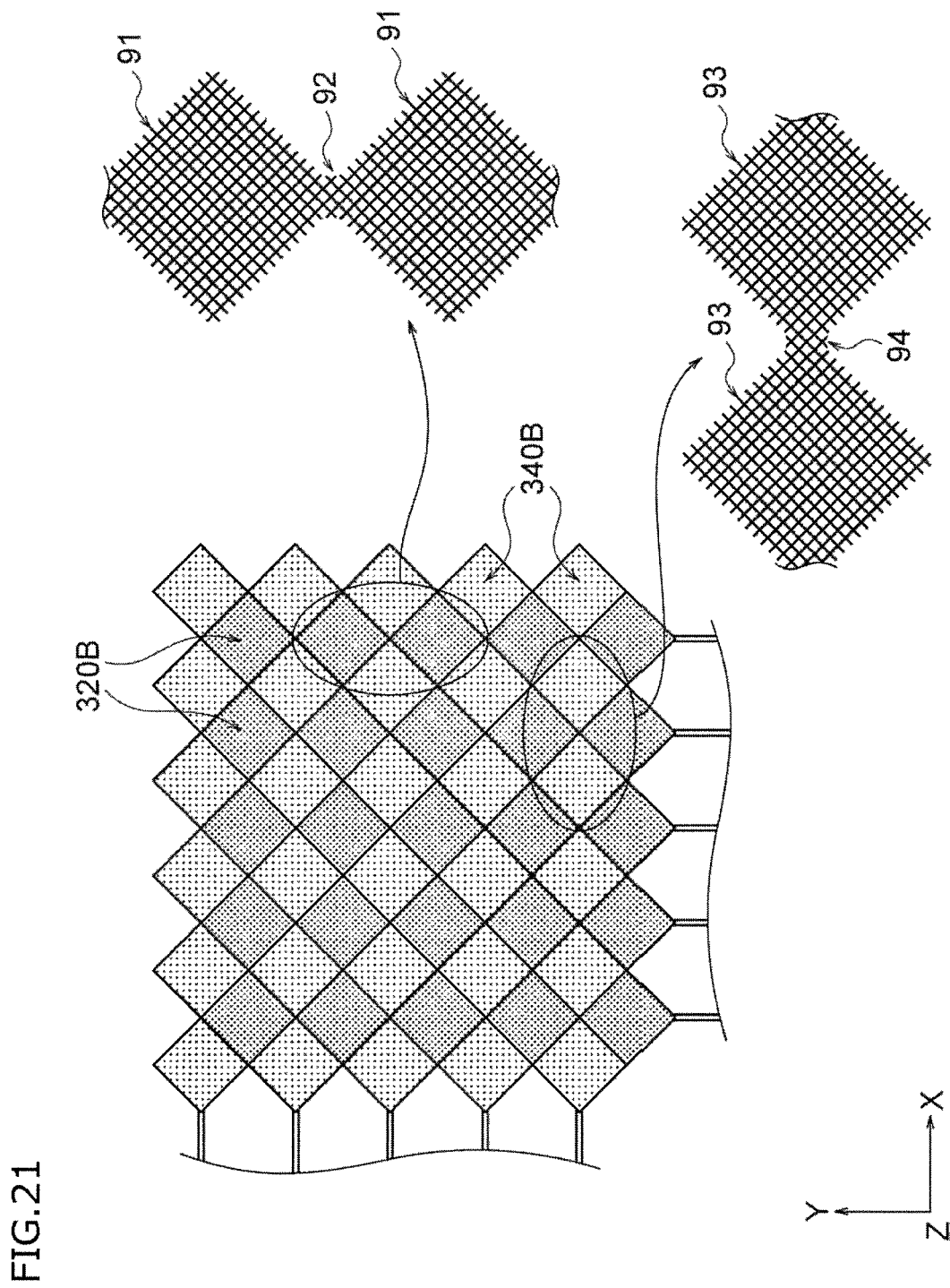

US 10,394,398 B2

WIRING BODY, WIRING BOARD, WIRING STRUCTURE, AND TOUCH SENSOR

TECHNICAL FIELD

The present invention relates to a wiring body, a wiring board, a wiring structure, and a touch sensor.

In the designated nations where incorporation of documents by reference is accepted, the contents of disclosed in Japanese Patent Application No. 2015-038626, filed on Feb. 27, 2015, and Japanese Patent Application No. 2015-038629, filed on Feb. 27, 2015 in Japan are incorporated by reference into this specification, and are regarded as a part of disclosure of this specfication.

BACKGROUND ART

A transparent touch panel formed by laminating a glass substrate and a transparent film, each having a transparent electrode formed thereon, is known (for example, refer to Patent Document 1).

CITATION LIST

Patent Document

Patent Document 1: JP 2587975 B2

SUMMARY OF THE INVENTION

Problem to be Solved by the Invention

In the technology described above, in order to extract a circuit of the transparent electrode on the glass substrate side to the outside, the transparent film is slit, an extraction circuit for a transparent electrode on the glass substrate side, which is disposed on the transparent film, and the transparent electrode on the glass substrate side are connected to each other, and a connection portion formed in the extraction circuit and the transparent electrode on the glass substrate side are performed thermocompression bonding through an anisotropic conductive adhesive agent, and thus, the extraction from the transparent film is performed. Thus, the transparent electrode on the glass substrate side has to be connected to the transparent film one time through the anisotropic conductive adhesive agent, and thus, durability or extractability deteriorates.

Problems to be solved by the present invention include providing a wiring body having excellent wiring extractability, a wiring board, a wiring structure, and a touch sensor.

Means for Solving Problem

[1] A wiring body according to the invention, includes: a first resin layer; a first conductor layer including a first terminal portion and is disposed on the first resin layer; a second resin layer covering the first conductor layer except for at least the first terminal portion; and a second conductor layer including a second terminal portion and directly disposed on the second resin layer, in which the first terminal portion and the second terminal portion are shifted from each other along a thickness direction of the first resin layer, the first terminal portion protrudes towards a side separated from the first resin layer in the thickness direction, and in a case where the first terminal portion is projected towards a direction orthogonal to the thickness direction, at least a part of a projection portion of the first terminal portion overlaps with the second resin layer.

[2] In the invention described above, the first conductor layer may further include a mesh-like first electrode portion, the second conductor layer may further include a mesh-like second electrode portion, the first electrode portion and the first terminal portion may be integrally formed, and the second electrode portion and the second terminal portion may be integrally formed.

[3] In the invention described above, a maximum thickness of the second resin layer may be greater than a maximum thickness of the first conductor layer.

[4] In the invention described above, the maximum thickness of the second resin layer may be greater than a maximum thickness of the first resin layer.

[5] In the invention described above, the second resin layer corresponding to the second terminal portion may include a thin portion gradually becoming thin towards the first terminal portion side.

[6] In the invention described above, a thickness of the second resin layer corresponding to the second terminal portion on the second terminal portion side in an extending direction of the second conductor layer may relatively decrease.

[7] In the invention described above, in the first terminal portion, a surface roughness of a first adhesive surface adhering to the first resin layer may be rougher than a surface roughness of a surface on a side opposite to the first adhesive surface, and in the second terminal portion, a surface roughness of a second adhesive surface adhering to the second resin layer may be rougher than a surface roughness of a surface on a side opposite to the second adhesive surface.

[8] In the invention described above, the first terminal portion may include a tapered shape which narrows towards the side separated from the first resin layer, and the second terminal portion may include a tapered shape which narrows towards a side separated from the second resin layer.

[9] In the invention described above, the first resin layer may include a first protrusion protruding towards the first terminal portion, the first terminal portion may be disposed on the first protrusion, the second resin layer may include a second protrusion protruding towards the second terminal portion, and the second terminal portion may be disposed on the second protrusion.

[10] In the invention described above, the first resin layer may include a slit dividing the first terminal portion from the second terminal portion.

[11] A wiring structure according to the invention, includes: the wiring body described above; and a connection wiring board electrically connected to the wiring body, in which the connection wiring board includes a connection substrate, a first connection terminal disposed on the connection substrate to face the first terminal portion, and a second connection terminal disposed on the connection substrate to face the second terminal portion.

[12] In the invention described above, the first resin layer corresponding to the first terminal portion may be located closer to the connection substrate side with respect to the first resin layer corresponding to the second terminal portion.

[13] A wiring structure according to the invention, includes: the wiring body described above; and a connection wiring board electrically connected to the wiring body, in which the connection wiring board includes a connection substrate, a first connection terminal disposed on the connection substrate to face the first terminal portion, and a second connection terminal disposed on the connection substrate to face the second terminal portion, and the connection substrate includes a slit dividing the first connection terminal from the second connection terminal.

[14] In the invention described above, the first connection terminal may be located closer to the first resin layer side with respect to the second connection terminal.

[15] A wiring board according to the invention, includes: the wiring body described above or the wiring structure described above; and a support which supports the wiring body or the wiring structure.

[16] A touch sensor according to the invention, includes the wiring board of the invention described above.

EFFECT OF THE INVENTION

According to the invention, the wiring body includes the first resin layer, the first conductor layer disposed on the first resin layer, the second resin layer, and the second conductor layer disposed on the second resin layer, and the first terminal portion of the first conductor layer and the second terminal portion of the second conductor layer are shifted from each other along the thickness direction of the first resin layer. That is, both of the first terminal portion and the second terminal portion are exposed to one surface side of the wiring body. For this reason, it is not necessary to connect the transparent electrode to the transparent film or the like through the anisotropic conductive adhesive agent or the like, and it is possible to extract the first terminal portion and the second terminal portion, and thus, it is possible to improve the wiring extractability.

BRIEF DESCRIPTION OF DRAWINGS

FIG. 12(A) to FIG. 12(I) are sectional views for describing a manufacturing method of a wiring board of the first embodiment of the invention;

FIG. 19(A) to FIG. 19(L) are sectional views for describing a manufacturing method of the wiring structure of the second embodiment of the invention;

FIG. 20(A) and FIG. 20(B) are sectional views for describing a manufacturing method in a modification example of the wiring structure of the second embodiment of the invention; and FIG. 21 is a plan view illustrating modification examples of the first conductor layer and the second conductor layer of the embodiment of the invention.

MODE(S) FOR CARRYING OUT THE INVENTION

Hereinafter, embodiments of the invention will be described on the basis of the drawings.

<<First Embodiment>>

Figure 1:
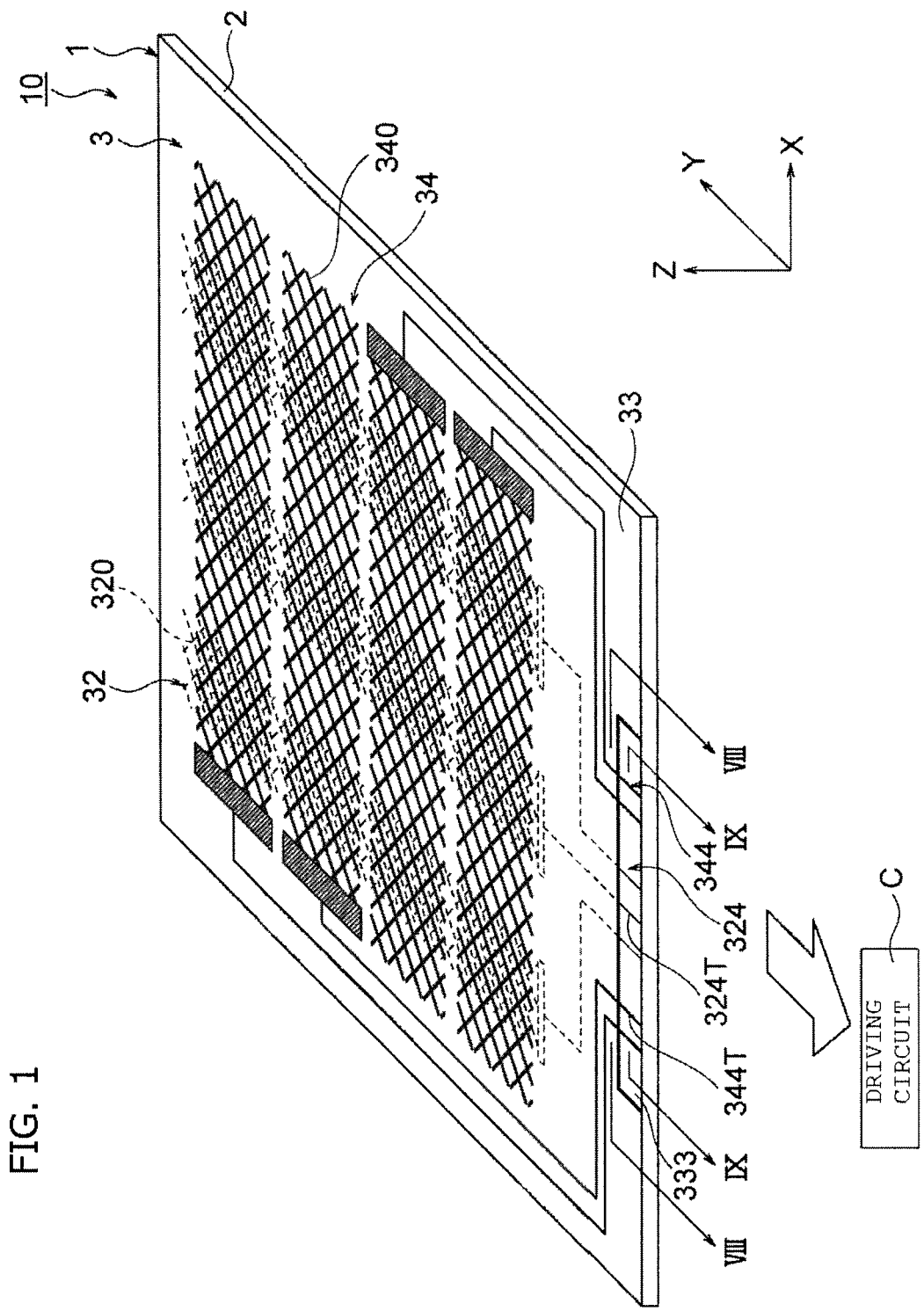
FIG. 1 is a perspective view illustrating a touch sensor of a first embodiment of the invention.
Figure 2:
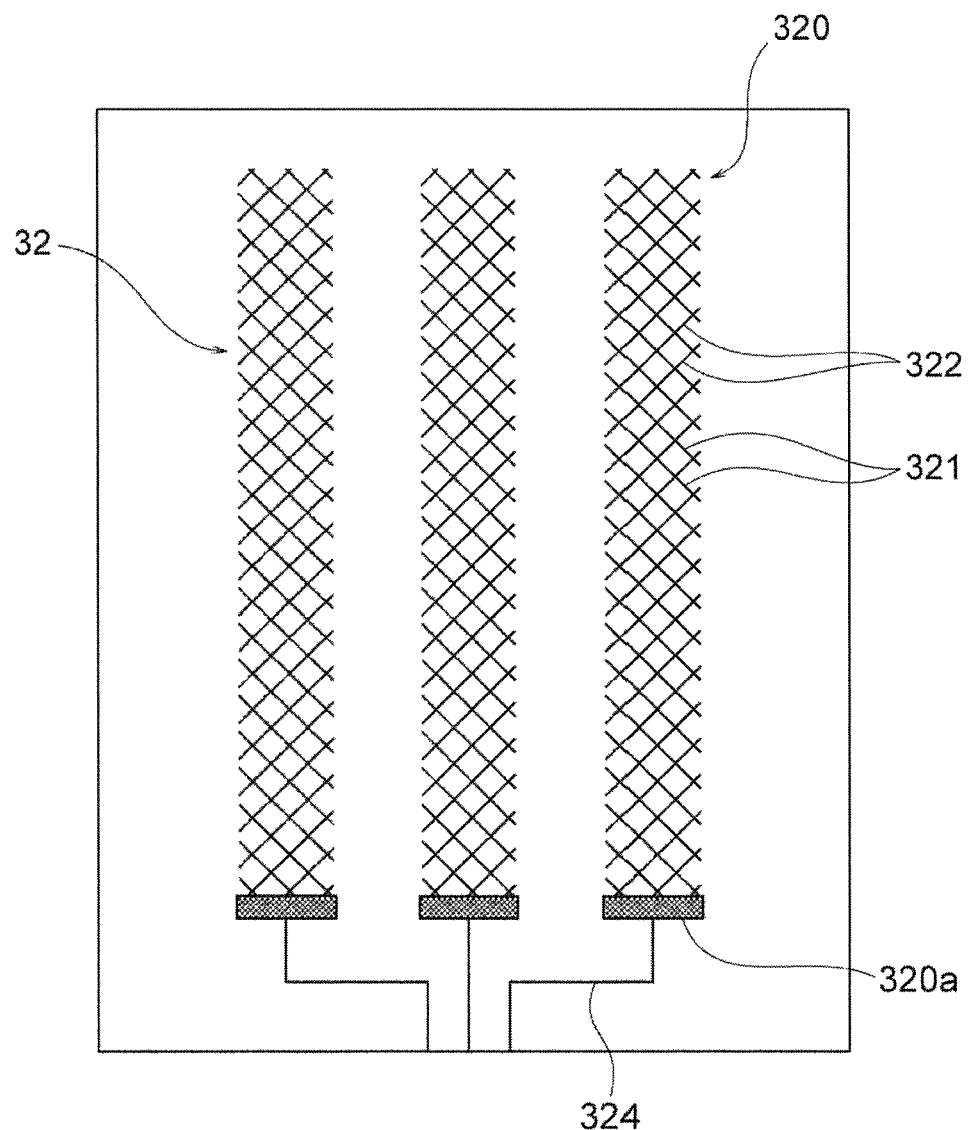
FIG. 2 is a plan view illustrating a first conductor layer of the first embodiment of the invention.
Figure 3:
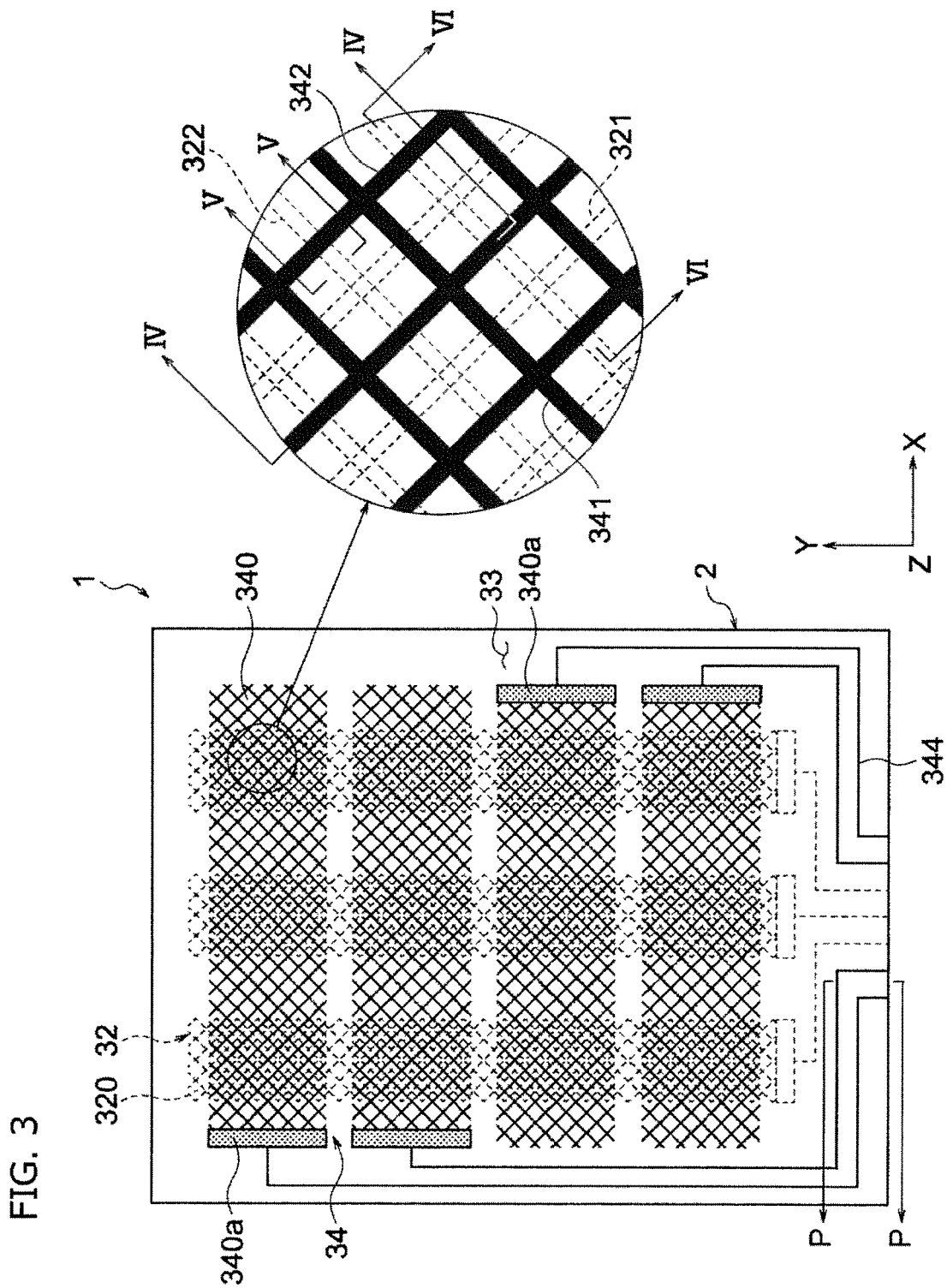
FIG. 3 is a plan view illustrating a second conductor layer of the first embodiment of the invention.
Figure 4:
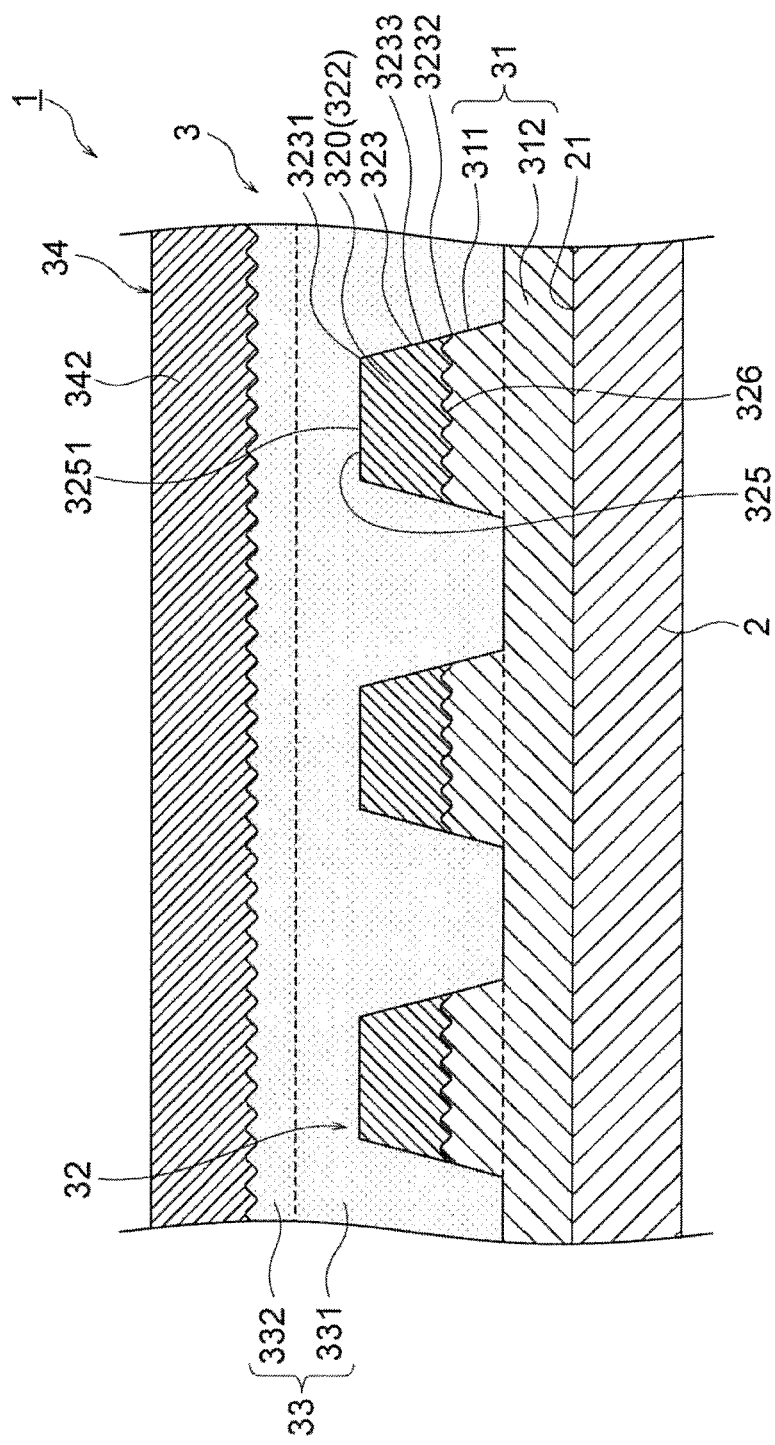
FIG. 4 is a sectional view taken along line IV-IV of FIG. 3.
Figure 5:
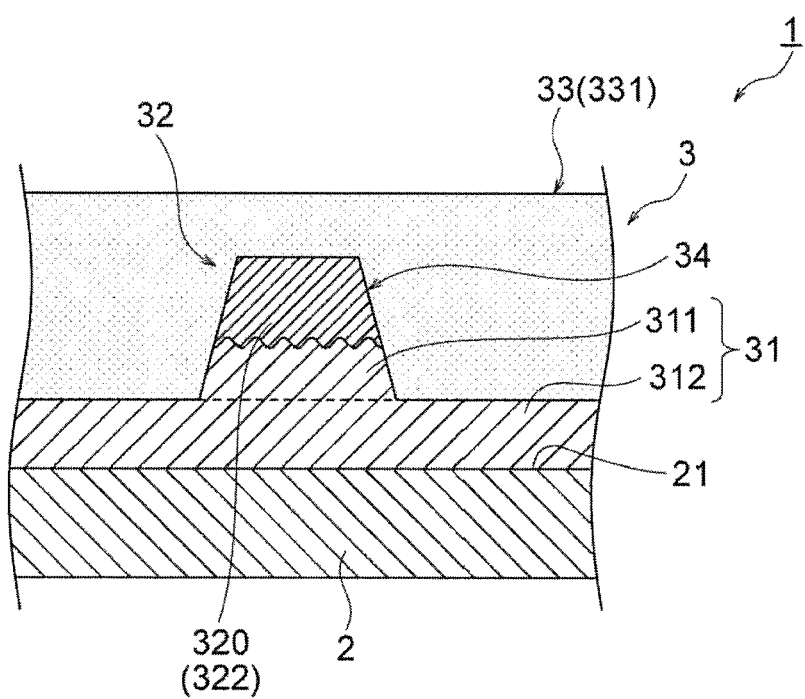
FIG. 5 is a sectional view taken along line V-V of FIG. 3.
Figure 6:
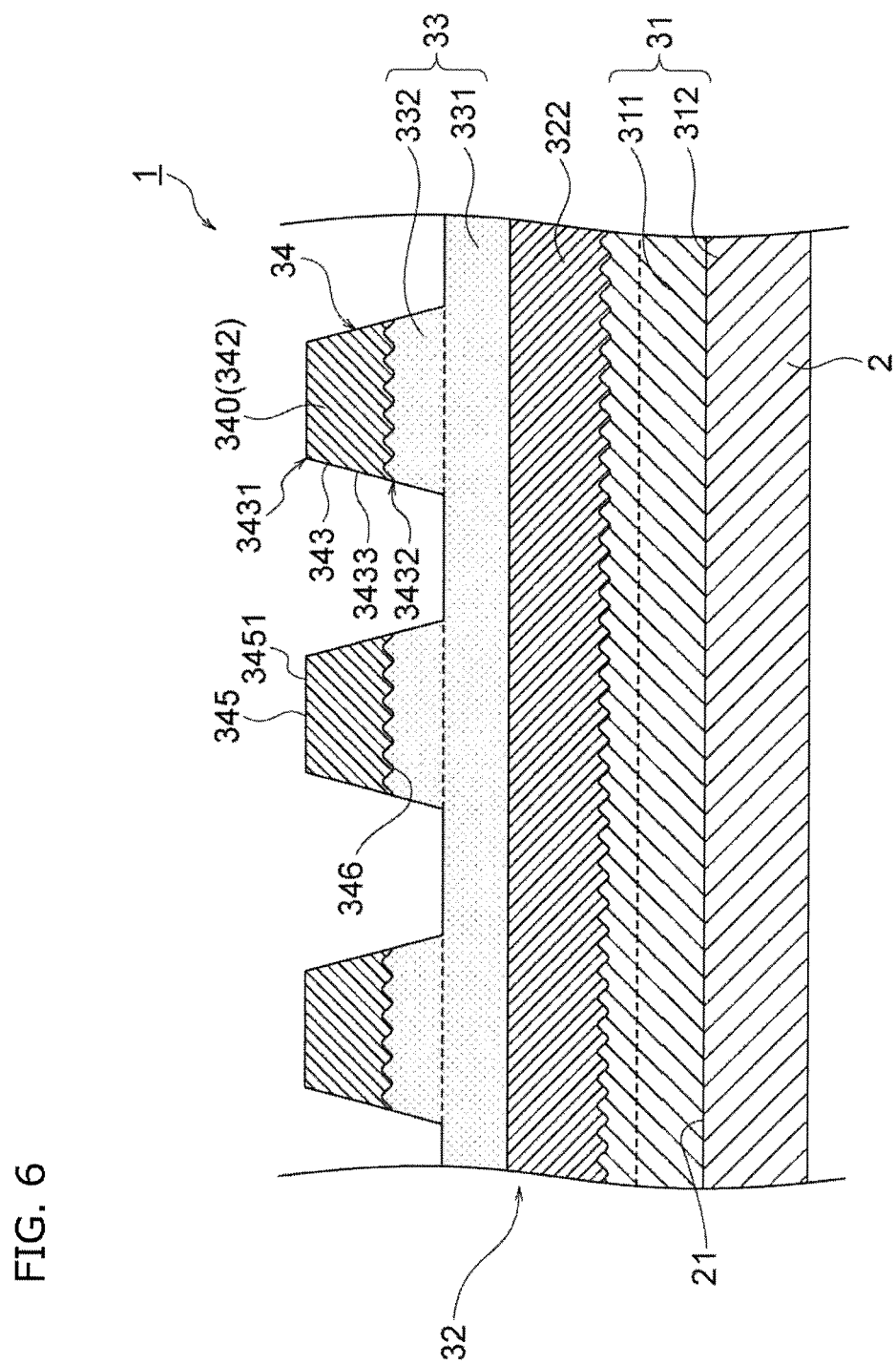
FIG. 6 is a sectional view taken along line VI-VI of FIG. 3.
Figure 7:
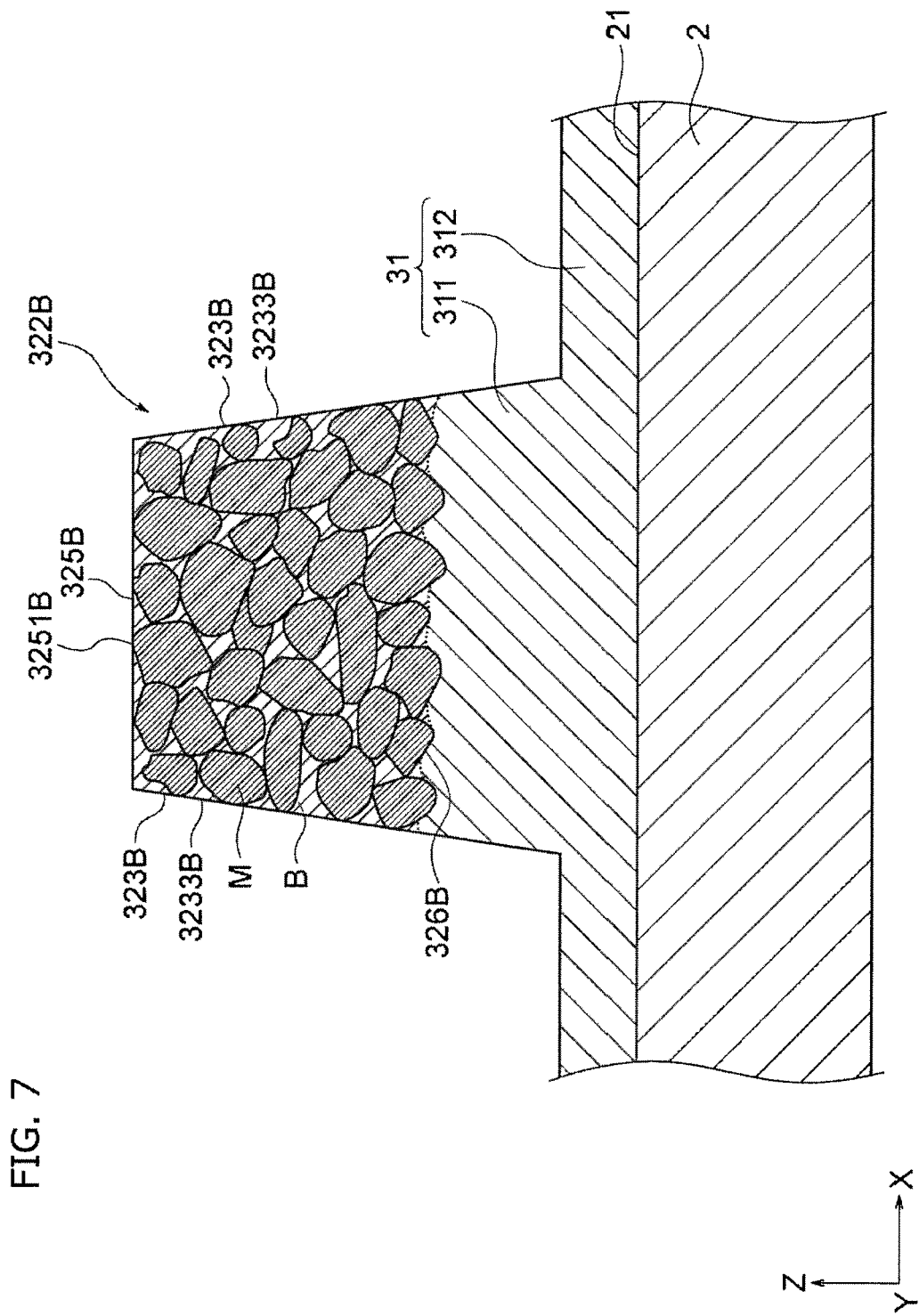
FIG. 7 is a sectional view in a width direction for describing a structure of a first conductor wire of the first embodiment of the invention.
Figure 8:
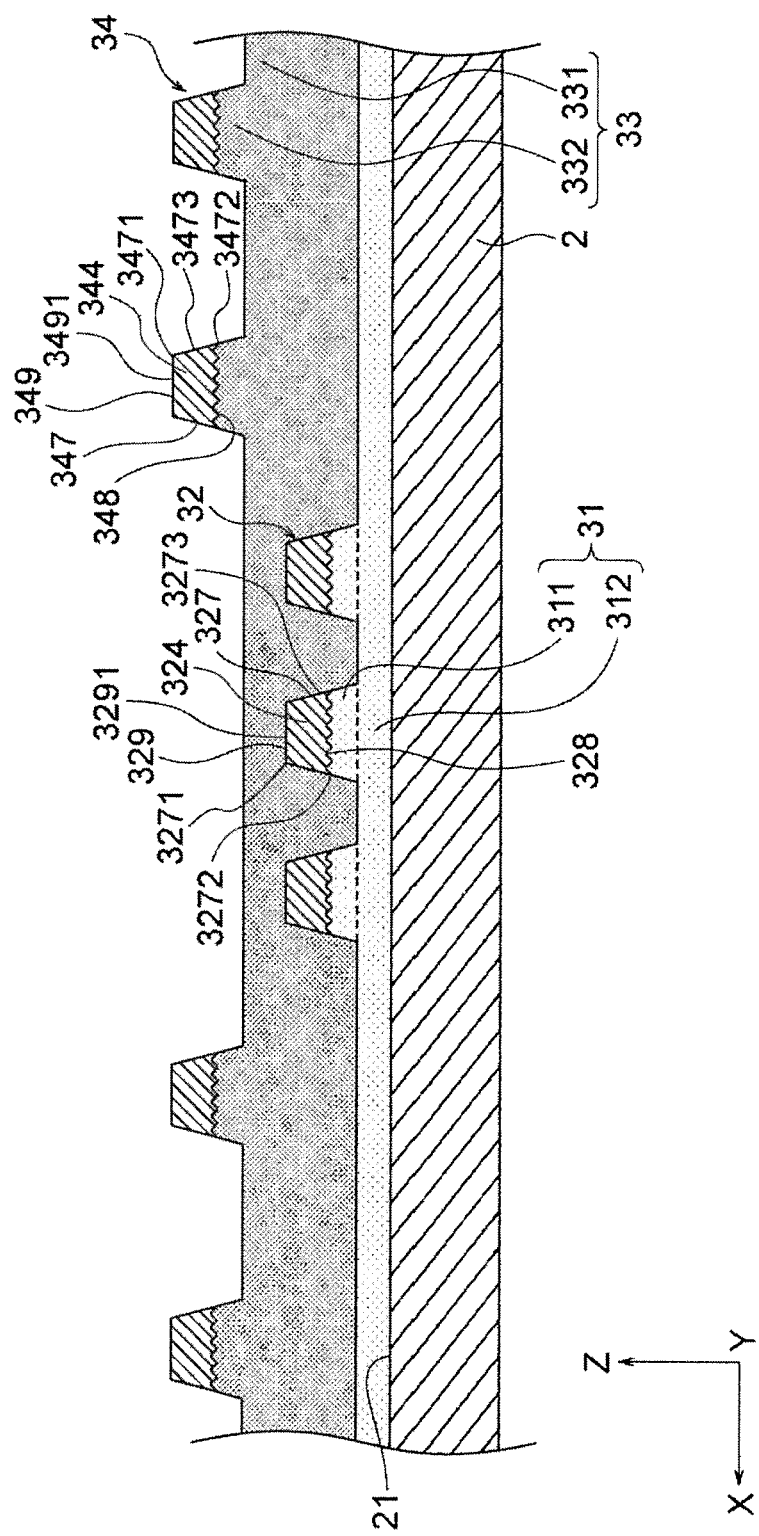
FIG. 8 is a sectional view taken along line VIII-VIII of FIG. 1.
Figure 9:
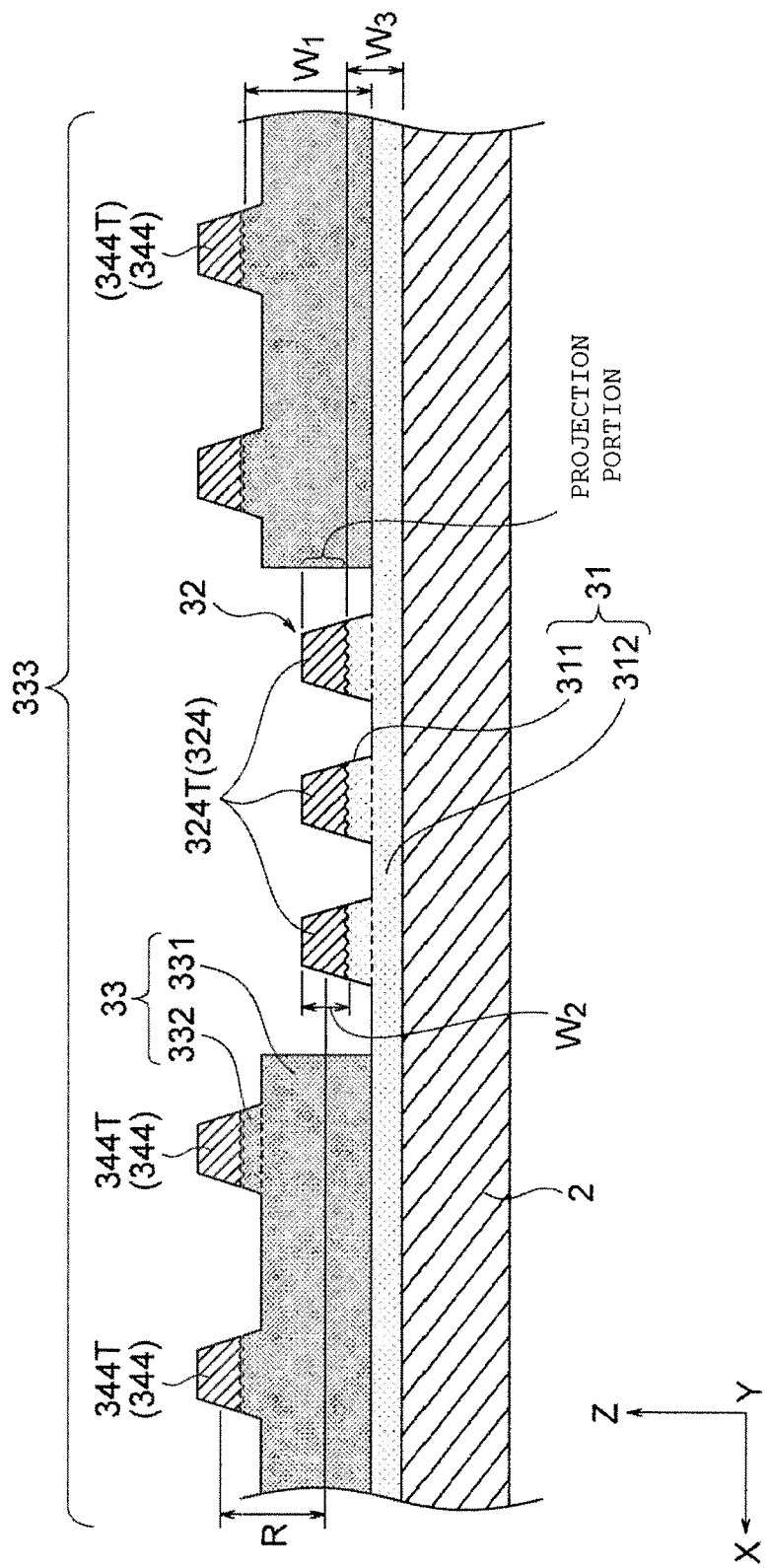
FIG. 9 is a sectional view taken along line IX-IX of FIG. 1.
Figure 10:
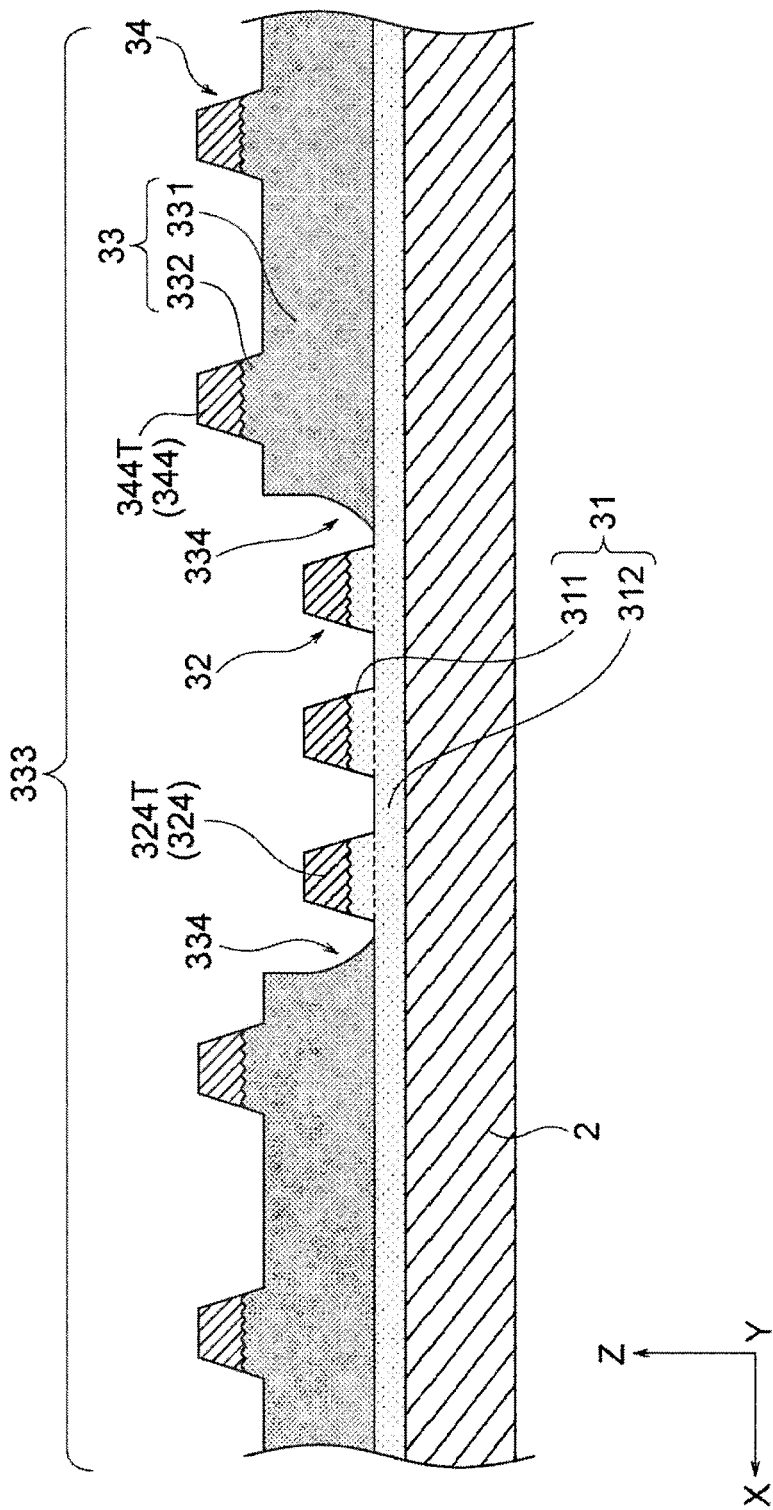
FIG. 10 is a sectional view illustrating a first modification example of a second resin layer of the first embodiment of the invention.
Figure 11:
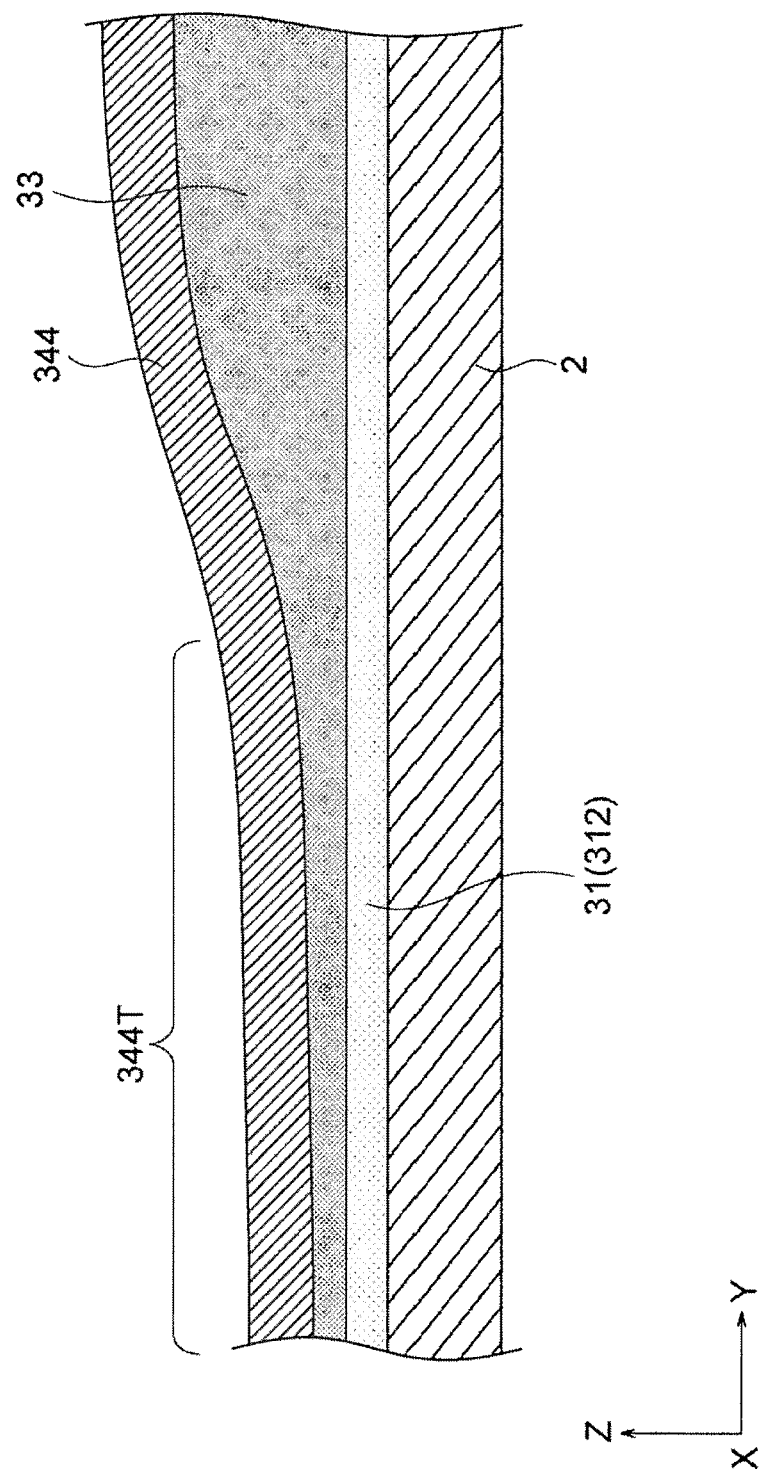
FIG. 11 is a sectional view illustrating a second modification example of the second conductor layer of the first embodiment of the invention.
Figure 13A:
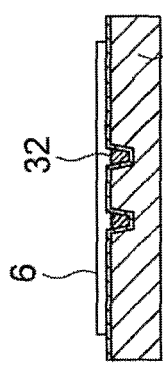
FIG. 13(A) to FIG. 13(I) are sectional views for describing a modification example of the manufacturing method of the wiring board of the first embodiment of the invention.
Figure 13B:
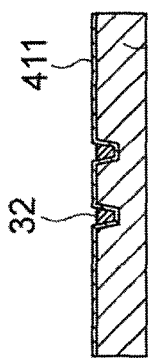
Figure 13C:
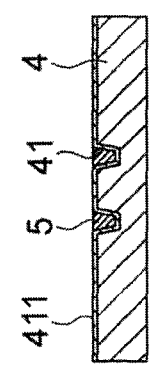
Figure 13D:
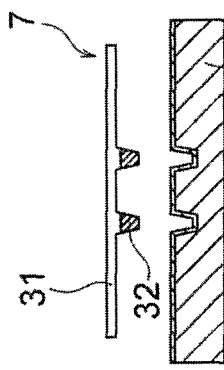
Figure 13E:
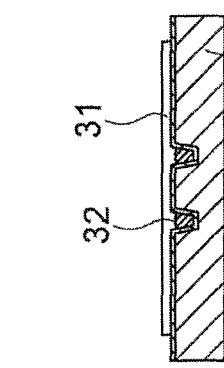
Figure 13F:
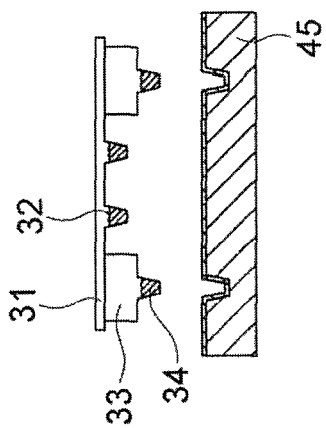
Figure 13G:
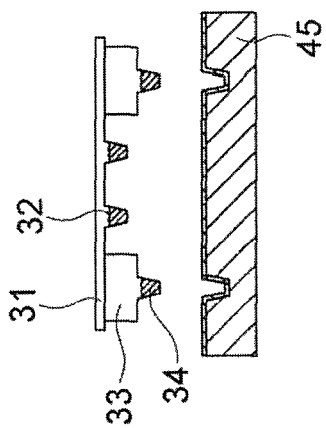
Figure 13H:
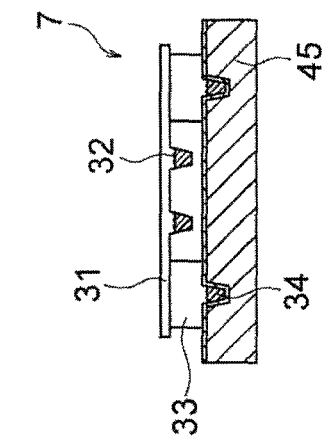
Figure 13I:
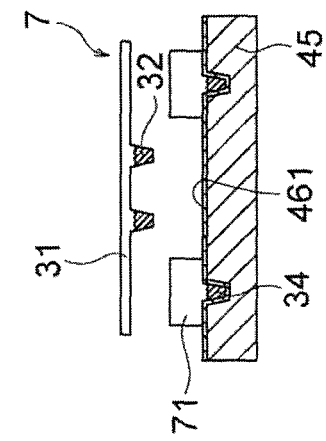

FIG. 1 is a perspective view illustrating a touch sensor of a first embodiment of the invention, FIG. 2 is a plan view illustrating a first conductor layer of the first embodiment of the invention, FIG. 3 is a plan view illustrating a second conductor layer of the first embodiment of the invention, FIG. 4 is a sectional view taken along line IV-IV of FIG. 3, FIG. 5 is a sectional view taken along line V-V of FIG. 3, and FIG. 6 is a sectional view taken along line VI-VI of FIG. 3. In addition, FIG. 7 is a sectional view in a width direction for describing a structure of a first conductor wire of the first embodiment of the invention, FIG. 8 is a sectional view taken along line VIII-VIII of FIG. 1, FIG. 9 is a sectional view taken along line IX-IX of FIG. 1, FIG. 10 is a sectional view illustrating a first modification example of a second resin layer of the first embodiment of the invention, and FIG. 11 is a sectional view illustrating a second modification example of the second conductor layer of the first embodiment of the invention (a sectional view corresponding to line P-P of FIG. 3).

A touch sensor 10 of this embodiment, for example, is a touch input device which is used in an electrostatic capacitance type touch panel, an electrostatic capacitance type touch pad, or the like, and as illustrated in FIG. 1, includes a substrate 2 and a wiring body 3 disposed on the substrate 2. The wiring body 3 includes an adhesive layer 31, a first conductor layer 32, a resin layer 33, and a second conductor layer (refer to FIG. 4 to FIG. 6).

As illustrated in FIG. 1, the substrate 2 has a rectangular shape, and is configured of a polyethylene terephthalate (PET) film. Furthermore, a material configuring the substrate 2 is not particularly limited thereto. For example, materials such as polyethylene naphthalate (PEN), a polyimide resin (PI), polyether imide resin (PEI), polycarbonate (PC), polyether ether ketone (PEEK), a liquid crystal polymer (LCP), a cycloolefin polymer (COP), a silicone resin (SI), an acrylic resin, a phenolic resin, an epoxy resin, a green sheet, and glass can be exemplified. An easily adhesive layer or an optical adjustment layer may be formed of such base materials. In addition, for example, a display may be used as the substrate 2. Furthermore, the shape of the substrate 2 is not particularly limited. The substrate 2 of this embodiment corresponds to an example of a support of the invention.

The adhesive layer 31 as the resin layer is a layer for allowing the substrate 2 and the first conductor layer 32 to adhere and to be fixed to each other, and as illustrated in FIG. 4 or FIG. 5, is disposed on the entire main surface 21 of the substrate 2. A UV curable resin such as an epoxy resin, an acrylic resin, a polyester resin, a urethane resin, a vinyl resin, a silicone resin, a phenolic resin, and a polyimide resin, a thermosetting resin or a thermoplastic resin, ceramics, and the like can be exemplified as an adhesive material configuring the adhesive layer 31. As illustrated in FIG. 4, the adhesive layer 31 includes a support portion 311 supporting a first conductor wire 322 (described below), and a smooth portion 312 disposed between the support portion 311 and the main surface 21 of the substrate 2 and covers the main surface 21, and the support portion 311 and the smooth portion 312 are integrally formed. The support portion 311 of this embodiment corresponds to an example of a first protrusion of the invention.

As illustrated in FIG. 4, a sectional shape of the support portion 311 of this embodiment (a sectional shape in an extending direction of the first conductor wire 322 (described below)) is a shape which narrows towards a direction separated from the substrate 2 (a +Z axis direction in FIG. 2). In addition, a boundary between the support portion 311 and the first conductor wire 322 has a concave-convex shape corresponding to a concave-convex shape of a lower surface 326 of the first conductor wire 322. Such a concave-convex shape is formed on the basis of the surface roughness of the lower surface 326 of the first conductor wire 322. Furthermore, as illustrated in FIG. 6, the boundary between the support portion 311 and the first conductor wire 322 in the sectional surface along the extending direction of the first conductor wire 322 also has a concave-convex shape corresponding to the concave-convex shape of the lower surface 326 of the first conductor wire 322. The surface roughness of the lower surface 326 will be described below in detail. In FIG. 4 and FIG. 6, in order to describe the wiring body 3 of this embodiment to be easily understood, the concave-convex shape of the boundary between the support portion 311 and the first conductor wire 322 is exaggeratingly illustrated.

The smooth portion 312 is disposed on the entire main surface 21 of the substrate 2 with approximately an even height (a thickness). The thickness of the smooth portion 312 can be set to be within a range of 5 μm to 100 μm, but is not particularly limited. The support portion 311 is disposed on the smooth portion 312, and thus, the adhesive layer 31 protrudes in the support portion 311, and the rigidity of the first conductor wire 322 in the support portion 311 is improved.

Furthermore, the adhesive layer 31 may be configured only of the support portion 311 by omitting the smooth portion 312 from the adhesive layer 31. In this case, the light transmittance of the entire wiring board 1 is improved, and thus, it is possible to improve the visibility of the touch sensor 10. The adhesive layer 31 of this embodiment corresponds to an example of a first resin layer of the invention.

The first conductor layer 32, for example, is a layer which functions as an electrode or a lead-out wire. The first conductor layer 32 is configured of a conductive material (a conductive powder or conductive particles) containing a metal material such as silver, copper, nickel, tin, bismuth, zinc, indium, and palladium, and a carbon-based material such as graphite or carbon black (furnace black, acetylene black, and Ketjen black), a carbon nanotube, and a carbon nanofiber, a binder resin containing an acrylic resin, a polyester resin, an epoxy resin, a vinyl resin, a urethane resin, a phenolic resin, a polyimide resin, a silicone resin, a fluorine resin, and the like.

In the description using the first conductor wire 322 as an example, a conductive material which, for example, has a diameter ϕ of 0.5 μm to 2 μm (0.5≤ϕ≤2) according to the width of the first conductor wire 322, can be used as the conductive material contained in the first conductor layer 32. Furthermore, it is preferable to use a conductive material having an average diameter ϕ of less than or equal to half of the width of the first conductor wire 322 to be formed, from the viewpoint of stabilizing an electric resistance value of the first conductor wire 322. In addition, it is preferable to use particles having a specific surface area of greater than or equal to 20 m$^2$/g which is measured by a BET method, as the conductive material.

In a case where a comparatively small electric resistance value of less than or equal to a certain value is required as the first conductor layer 32, it is preferable to use a metal material as the conductive material. In a case where a comparatively large electric resistance value of greater than or equal to a certain value is allowed as the first conductor layer 32, it is possible to use a carbon-based material as the conductive material. Furthermore, it is preferable to use the carbon-based material as the conductive material, from the viewpoint of improving the haze or the total light ray reflectance of a mesh film.

Such a first conductor layer 32 is formed by applying and hardening a conductive paste. A conductive paste configured by mixing a conductive material with a binder resin, water or a solvent, and various additives can be exemplified as a specific example of the conductive paste. α-Terpineol, butyl carbitol acetate, butyl carbitol, 1-decanol, butyl cellosolve, diethylene glycol monoethyl ether acetate, tetradecane, and the like can be exemplified as the solvent contained in the conductive paste. Furthermore, a metal salt may be used as the conductive material described above. Examples of the metal salt are capable of including the salts of the metals described above. In addition, the binder resin may be omitted from the materials configuring the first conductor layer 32.

As illustrated in FIG. 2, the first conductor layer 32 of this embodiment includes a first electrode pattern 320 extending along a Y axis direction in FIG. 2, and lead-out wire 324 connected to the first electrode pattern 320. In this embodiment, three first electrode patterns 320 are arranged approximately at regular intervals along an X axis direction in FIG. 2. Furthermore, the number and the arrangement of first electrode patterns 320 included in the first conductor layer 32 are not particularly limited to the above description.

The first electrode pattern 320 includes first conductor wires 321 and 322. As illustrated in FIG. 2, the first conductor wire 321 linearly extends, and the first conductor wire 322 also linearly extends. In addition, the first conductor wires 321 are arranged in parallel with each other approximately at regular intervals, and the first conductor wires 322 are also arranged in parallel with each other approximately at regular intervals. In this embodiment, the first conductor wire 321 and the first conductor wire 322 are orthogonal to each other, and thus, the first electrode pattern 320 is in the shape of a mesh having a rectangular lattice.

In this embodiment, the first conductor wires 321 and 322 are arranged by being respectively inclined at 45 degrees with respect to an extending direction of the first electrode pattern 320 (the Y axis direction in FIG. 2), and may be arranged by being respectively inclined at other angles (for example, 30 degrees). In addition, one of the first conductor wires 321 and 322 may be disposed by being inclined at 90 degrees with respect to the extending direction of the first electrode pattern 320 (the Y axis direction in FIG. 2).

Furthermore, the first conductor wires 321 and 322 may extend into the shape of a curve, a horseshoe, a zigzag line, and the like, or a linear portion and portions in the shape of a curve, a horseshoe, a zigzag line, and the like may be mixed. In addition, in this embodiment, the first conductor wires 321 and 322 have wire widths which are approximately identical to each other, but the first conductor wires 321 and 322 may have wire widths which are different from each other.

The width of the first conductor wires 321 and 322 is preferably within a range of 50 nm to 1000 µm, is more preferably within a range of 500 nm to 150 µm, and is still even more preferably within a range of 1 µm to 10 µm, and is even more preferably within a range of 1 µm to 5 µm. In addition, the height of the first conductor wires 321 and 322 is preferably within a range of 50 nm to 3000 µm, is more preferably within a range of 500 nm to 450 µm, and is even more preferably within a range of 500 nm to 10 µm.

Furthermore, the shape of each reticulation of a mesh configured of the first conductor wires 321 and 322 is not particularly limited. For example, each of the reticulations may be in the shape of a geometrical pattern as described below. That is, the reticulation of the mesh configured of the first conductor wires 321 and 322 may be in the shape of a triangle such as an equilateral triangle, an isosceles triangle, and a right triangle, or may be in the shape of a quadrangle such as a parallelogram and a trapezoid. In addition, the reticulation may be in the shape of an n-polygon such as a hexagon, an octagon, a dodecagon, and an icosagon, a circle, an ellipse, a star, or the like.

In this embodiment, a side portion 320a of the first electrode pattern 320, which is connected to the lead-out wire 324, is wider than the first conductor wires 321 and 322. Even though it is not particularly illustrated, a frame portion surrounding at least a part of the mesh-like shape formed of the first conductor wires 321 and 322 may include the first electrode pattern 320. In this embodiment, the first conductor wires 321 and 322, the side portion 320a, and the lead-out wire 324 are integrally formed.

As illustrated in FIG. 4, a side portion 323 of the first conductor wire 322 and a side portion of the support portion 311 of the adhesive layer 31 are smoothly continuous, and thus, form one flat surface. The first conductor wire 322 has a tapered shape which narrows towards the second conductor layer 34 side, and thus, a sectional surface of the first conductor wire 322 (a sectional surface of the first conductor wire 322 in the extending direction) is approximately in the shape of a trapezoid. Furthermore, the sectional shape of the first conductor wire 322 is not particularly limited thereto. For example, the sectional surface of the first conductor wire 322 may be in the shape of a square, a rectangle, a triangle, and the like. Furthermore, in this embodiment, the first conductor wire 321 also has the same sectional shape as that of the first conductor wire 322.

In FIG. 4, the lower surface 326 of the first conductor wire 322 of this embodiment is an adhesive surface adhering to the support portion 311. On the other hand, an upper surface 325 is positioned on a side opposite to the lower surface 326 of the first conductor wire 322. The upper surface 325 is substantially parallel to the main surface 21 of the substrate 2 (an upper surface of the smooth portion 312 of the adhesive layer 31).

The upper surface 325 includes a flat portion 3251 in the sectional surface of the first conductor wire 322 in a width direction. The flat portion 3251 is a linear portion existing in the upper surface 325 (that is, a portion having a maximum curvature radius), in the sectional surface of the first conductor wire 322 in the width direction, and has a flatness of less than or equal to 0.5 µm. Furthermore, the flatness can be defined by a JIS method (JIS B0621 (1984)).

In this embodiment, the flatness of the flat portion 3251 is obtained by using a non-contact type measurement method using laser light. Specifically, a measurement target (specifically, the upper surface 325) is irradiated with strip-like laser light, and reflection light thereof is subjected to image formation on an imaging element (for example, a two-dimensional CMOS), and thus, the flatness is measured. A method in which in a flat surface of a target, a flat surface passing through each of three points which are maximally separated from each other is set, and a maximum value of a deviation thereof is calculated as the flatness (a maximum deviation type flatness) is used as a calculation method of the flatness. Furthermore, the measurement method or the calculation method of the flatness is not particularly limited to the above description. For example, the measurement method of the flatness may be a contact type measurement method using a dial gauge or the like. In addition, the calculation method of the flatness may be a method in which the value of a gap which can be formed at the time of interposing a flat surface, which becomes a target, between parallel flat surfaces is calculated as the flatness (a maximum inclination type flatness).

The flat portion 3251 of this embodiment is formed approximately on the entire upper surface 325. Furthermore, the flat portion 3251 may be formed on a part of the upper surface 325, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The side portion 323 is positioned between the upper surface 325 and the lower surface 326. The side portion 323 is connected to the upper surface 325 in a first portion 3231, and is connected to the lower surface 326 in a second portion 3232. The first conductor wire 322 of this embodiment has a tapered shape which narrows towards the second conductor layer 34 side, and thus, the second portion 3232 is positioned on the outside from the first portion 3231. The side portion 323 of this embodiment is a linear surface extending on a virtual straight line (not illustrated) which passes through the first portion 3231 and the second portion 3232, in the sectional surface of the first conductor wire 322 in the width direction.

Furthermore, the shape of the side portion 323 is not particularly limited to the above description. For example, the side portion 323 may protrude to the outside from the virtual straight line which passes through the first portion 3231 and the second portion 3232, in the sectional surface of the first conductor wire 322 in the width direction. Thus, it is preferable that the side portion 323 has a shape which is not recessed to the inside from the virtual straight line passing through the first portion and the second portion (a shape in which the bottom of the first conductor wire 322 does not widen), in the sectional surface of the first conductor wire 322 in the width direction.

The side portion 323 of this embodiment includes a flat portion 3233 in the sectional surface of the first conductor wire 322 in the width direction. The flat portion 3233 is a linear portion existing in the side portion 323 (that is, a portion having a maximum curvature radius), in the sectional surface of the first conductor wire 322 in the width direction, and has a flatness of less than or equal to 0.5 µm. The flatness of the flat portion 3233 can be measured by using the same method as the measurement method of the flatness of the flat portion 3251. In this embodiment, the flat portion 3233 is formed approximately in the entire side portion 323. Furthermore, the shape of the flat portion 3233 is not particularly limited to the above description, and the flat portion 3233 may be formed in a part of the side portion 323.

An angle $\theta_1$ between the side portion 323 and the upper surface 325 is preferably within a range of 90° to 170° (90°≤$\theta_1$≤170°), and is more preferably within a range of 90° to 120° (90°≤$\theta_1$≤120°), from the viewpoint of suppressing the diffuse reflection of light on the side portion 323. In this embodiment, in one first conductor wire 322, an angle between one side portion 323 and the upper surface 325 and an angle between the other side portion 323 and the upper surface 325 are substantially identical to each other. Furthermore, in one first conductor wire 322, the angle between one side portion 323 and the upper surface 325 and the angle between the other side portion 323 and the upper surface 325 may be different from each other.

In this embodiment, it is preferable that the surface roughness of the lower surface 326 of the first conductor wire 322 in FIG. 4 is rougher than the surface roughness of the upper surface 325 of the first conductor wire 322 in FIG. 4, from the viewpoint of increasing a contact area between the first conductor wire 322 and the adhesive layer 31, and of rigidly fixing the first conductor wire 322 to the adhesive layer 31. In this embodiment, the upper surface 325 includes the flat portion 3251, and thus, a relative relationship of the surface roughness of the first conductor wire 322 described above (a relationship in which the surface roughness of the lower surface 326 is relatively rougher than the surface roughness of the upper surface 325) is established. Specifically, it is preferable that surface roughness Ra of the lower surface 326 of the first conductor wire 322 is within a range of 0.1 µm to 3 µm, whereas the surface roughness Ra of the upper surface 325 is within a range of 0.001 µm to 1.0 µm. Furthermore, it is more preferable that the surface roughness Ra of the lower surface 326 of the first conductor wire 322 is within a range of 0.1 µm to 0.5 µm, and it is more preferable that the surface roughness Ra of the upper surface 325 is within a range of 0.001 µm to 0.3 µm. In addition, a ratio of the surface roughness of the upper surface 325 to the surface roughness of the lower surface 326 (the surface roughness of the upper surface 325 with respect to the surface roughness of the lower surface 326) is preferably greater than or equal to 0.01 and less than 1, and is more preferably greater than or equal to 0.1 and less than 1. In addition, it is preferable that the surface roughness of the upper surface 325 is less than or equal to ⅕ of the width (a maximum width) of the first conductor wire 322. Furthermore, such surface roughness can be measured by a JIS method (JIS B0601 (revised on Mar. 21, 2013)). The surface roughness of the lower surface 326 and the surface roughness of the upper surface 325 may be measured along the width direction of the first conductor wire 322 (refer to FIG. 4), or may be measured along the extending direction of the first conductor wire 322 (refer to FIG. 6).

Incidentally, as described in the JIS method (JIS B0601 (revised on Mar. 21, 2013)), the "surface roughness Ra" herein indicates "arithmetic average roughness Ra". The "arithmetic average roughness Ra" indicates a roughness parameter obtained by blocking a long wavelength component (a waviness component) from a sectional curve. The waviness component is separated from the sectional curve on the basis of measurement conditions required for obtaining a form (for example, the dimension and the like of the target).

In addition, in this embodiment, the side portion 323 also includes the flat portion 3233. Then, as with the upper surface 325, the surface roughness of the lower surface 326 is rougher than the surface roughness of the side portion 323 including the flat portion 3233. Specifically, it is preferable that the surface roughness Ra of the side portion 323 is within a range of 0.001 µm to 1.0 µm, with respect to the surface roughness Ra of the lower surface 326 described above. Furthermore, it is more preferable that the surface roughness Ra of the side portion 323 is within a range of 0.001 µm to 0.3 µm. The surface roughness of the side portion 323 may be measured along the width direction of the first conductor wire 322, or may be measured along the extending direction of the first conductor wire 322.

In this embodiment, the upper surface 325 includes the flat portion 3251, and the side portion 323 includes the flat portion 3233. In this case, it is preferable that the diffuse reflectance of the wiring body 3 on a side of a surface except for the lower surface 326 (that is, the side of the surface including the upper surface 325 and the side portion 323) is relatively smaller than the diffuse reflectance of the wiring body 3 on a side of the lower surface 326. Specifically, a ratio of the diffuse reflectance of the wiring body 3 on the side of the surface except for the lower surface 326 to the diffuse reflectance of the wiring body 3 on the side of the lower surface 326 (the diffuse reflectance of the wiring body 3 on the side of the surface except for lower surface 326 with respect to the diffuse reflectance of the wiring body 3 on the side of the lower surface 326) is preferably greater than or equal to 0.1 and less than 1, and is more preferably greater than or equal to 0.3 and less than 1.

An example of the shape of a first conductor wire 322B having a relative relationship of the surface roughness between the adhesive surface described above and the other surface will be described with reference to FIG. 7. The first conductor wire 322B illustrated in FIG. 7 is configured by including a conductive material M and a binder resin B. Then, in a sectional surface of the first conductor wire 322B in a width direction, a part of the conductive material M protrudes from the binder resin B in a lower surface 326B, and thus, the lower surface 326B has a concave-convex shape. On the other hand, in the sectional surface of the first conductor wire 322B in the width direction, the binder resin B is inserted between the conductive materials M in an upper surface 325B and a side portion 323B, and the binder resin B covers the conductive material M. Accordingly, a flat portion 3251B is formed in the upper surface 325B. In addition, a flat portion 3233B is formed in the side portion 323B. Furthermore, in the upper surface 325B and the side portion 323B, the conductive material M is covered with the binder resin B, the electrical insulating properties between the adjacent first conductor wires 322 are improved, and the occurrence of a migration is suppressed.

In a shape illustrated in FIG. 7, a part of the conductive material M protrudes from the binder resin B in the lower surface 326B, and thus, the surface roughness of the lower surface 326B comparatively increases. In contrast, the conductive material M is covered with the binder resin B in the upper surface 325B, and thus, the surface roughness of the upper surface 325B comparatively decreases. Accordingly, the surface roughness of the lower surface 326B is rougher than the surface roughness of the upper surface 325B.

In addition, as with the upper surface 325B, the conductive material M is covered with the binder resin B even in the side portion 323B, and thus, the surface roughness of the side portion 323B comparatively decreases. Accordingly, the surface roughness of the lower surface 326B is rougher than the surface roughness of the side portion 323B. Furthermore, the shape of the lower surface, the upper surface, and the side portion is not limited to the shape illustrated in FIG. 7.

As illustrated in FIG. 8, the lead-out wire 324 and the adhesive layer 31 in a portion corresponding to the lead-out wire 324 respectively have the same sectional shapes as those of the first conductor wire 322 and the adhesive layer 31 adhering to the first conductor wire 322.

That is, the adhesive layer 31 includes the support portion 311 and the smooth portion 312, and the lead-out wire 324 is disposed on the support portion 311. The side portion 327 of the lead-out wire 324 and the side portion of the support portion 311 of the adhesive layer 31 are smoothly continuous, and thus, form one flat surface. The lead-out wire 324 has a tapered shape which narrows towards the second conductor layer 34 side (a +Z axis direction side in FIG. 8), and thus, a sectional surface of the lead-out wire 324 (a sectional surface of the lead-out wire 324 in the extending direction) is approximately in the shape of a trapezoid. Furthermore, the sectional shape of the lead-out wire 324 is not particularly limited thereto. For example, the sectional surface of the lead-out wire 324 may be in the shape of a square, a rectangle, a triangle, and the like.

The lead-out wire 324 of this embodiment is configured of substantially the same material as the material configuring the first electrode pattern 320, and the first electrode pattern 320 and the lead-out wire 324 are integrally formed. In addition, a tip portion of the lead-out wire 324 is formed of a first terminal portion 324T (refer to FIG. 1) connected to an external terminal (not illustrated) and the like.

In FIG. 8, a lower surface 328 of the lead-out wire 324 of this embodiment is an adhesive surface adhering to the support portion 311. On the other hand, an upper surface 329 is positioned on a side opposite to the lower surface 328 in the lead-out wire 324. The upper surface 329 is substantially parallel to the main surface 21 f the substrate 2 (the upper surface of the smooth portion 312 of the adhesive layer 31).

The upper surface 329 includes a flat portion 3291 in the sectional surface of the lead-out wire 324 in a width direction. The flat portion 3291 is a linear portion existing in the upper surface 329 (that is, a portion having a maximum curvature radius), in the sectional surface of the lead-out wire 324 in the width direction, and has a flatness of less than or equal to 0.5 μm. Furthermore, the flatness can be defined by a JIS method (JIS B0621 (1984)). The flatness of the flat portion 3291 can be measured by using the same method as the measurement method of the flatness of the flat portion 3251.

The flat portion 3291 of this embodiment is formed approximately on the entire upper surface 329. Furthermore, the flat portion 3291 may be formed on a part of the upper surface 329, but is not particularly limited to the above description. In this case, for example, the flat portion is formed in a region in which both ends of the upper surface are not included. In a case where the flat portion is formed on a part of the upper surface, the width of the flat portion is at least ½ with respect to the width of the upper surface.

The side portion 327 is positioned between the upper surface 329 and the lower surface 328. The side portion 327 is connected to the upper surface 329 in a first portion 3271, and is connected to the lower surface 328 in a second portion 3272. The lead-out wire 324 of this embodiment has a tapered shape which narrows towards the second conductor layer 34 side, and thus, the second portion 3272 is positioned on the outside from the first portion 3271. The side portion 327 of this embodiment is a linear surface extending on a virtual straight line (not illustrated) which passes through the first portion 3271 and the second portion 3272, in the sectional surface of the lead-out wire 324 in the width direction.

Furthermore, the shape of the side portion 327 is not particularly limited to the above description. For example, the side portion 327 may protrude to the outside from the virtual straight line which passes through the first portion 3271 and the second portion 3272, in the sectional surface of the lead-out wire 324 in the width direction. Thus, it is preferable that the side portion 327 has a shape which is not recessed to the inside from the virtual straight line passing through the first portion and the second portion (a shape in which the bottom of the lead-out wire does not widen), in the sectional surface of the lead-out wire 324 in the width direction.

The side portion 327 of this embodiment includes a flat portion 3273 in the sectional surface of the lead-out wire 324 in the width direction. The flat portion 3273 is a linear portion existing in the side portion 327 (that is, a portion having a maximum curvature radius), in the sectional surface of the lead-out wire 324 in the width direction, and has a flatness of less than or equal to 0.5 μm. The flatness of the flat portion 3273 can be measured by the same method as the measurement method of the flatness of the flat portion 3251 described above. In this embodiment, the flat portion 3273 is formed approximately in the entire side portion 327. Furthermore, the shape of the flat portion 3237 is not particularly limited to the above description, and the flat portion 3237 may be formed in a part of the side portion 327.

An angle $\theta_2$ between the side portion 327 and the upper surface 329 is preferably within a range of 90° to 170° ($90°\leq\theta_2\leq170°$), and is more preferably within a range of 90° to 120° ($90°\leq\theta_2\leq120°$). In this embodiment, in one lead-out wire 324, an angle between one side portion 327 and the upper surface 329 and an angle between the other side portion 327 and the upper surface 329 are substantially identical to each other. Furthermore, in one lead-out wire 324, the angle between one side portion 327 and the upper surface 329 and the angle between the other side portion 327 and the upper surface 329 may be different from each other.

In this embodiment, it is preferable that the surface roughness of the lower surface (a first adhesive surface) 328 of the lead-out wire 324 in FIG. 8 is rougher than the surface roughness of the upper surface 329 of the lead-out wire 324 in FIG. 8, from the viewpoint of rigidly fixing the lead-out wire 324 to the adhesive layer 31. In this embodiment, the upper surface 329 includes the flat portion 3291, and thus, a relative relationship of the surface roughness of the lead-out wire 324 described above (a relationship in which the surface roughness of the lower surface 328 is relatively rougher than the surface roughness of the upper surface 329) is established. Specifically, it is preferable that the surface roughness Ra of the lower surface 328 of the lead-out wire 324 is within a range of 0.1 μm to 3 μm, whereas the surface roughness Ra of the upper surface 329 is within a range of 0.001 μm to 1.0 μm. Furthermore, it is more preferable that the surface roughness Ra of the lower surface 328 of the lead-out wire 324 is within a range of 0.1 μm to 0.5 μm, and it is more preferable that the surface roughness Ra of the upper surface 329 is within a range of 0.001 μm to 0.3 μm. In addition, a ratio of the surface roughness of the upper surface 329 to the surface roughness of the lower surface 328 (the surface roughness of the upper surface 329 with respect to the surface roughness of the lower surface 328) is preferably greater than or equal to 0.01 and less than 1, and is more preferably greater than or equal to 0.1 and less than 1. In addition, it is preferable that the surface roughness of the upper surface 329 is less than or equal to ⅕ of the width (a maximum width) of the lead-out wire 324. Furthermore, such surface roughness can be measured by a JIS method (JIS B0601 (revised on Mar. 21, 2013)). The surface roughness of the lower surface 328 and the surface roughness of the upper surface 329 may be measured along the width direction of the lead-out wire 324, or may be measured along the extending direction of the lead-out wire 324.

In addition, in this embodiment, the side portion 327 also includes the flat portion 3273. Then, as with the upper surface 329, the surface roughness of the lower surface 328 is rougher than the surface roughness of the side portion 327 including the flat portion 3273. Specifically, it is preferable that the surface roughness Ra of the side portion 327 is within a range of 0.001 μm to 1.0 μm, with respect to the surface roughness Ra of the lower surface 328 described above. Furthermore, it is more preferable that the surface roughness Ra of the side portion 327 is within a range of 0.001 μm to 0.3 μm. The surface roughness of the side portion 327 may be measured along the width direction of the lead-out wire 324, or may be measured along the extending direction of the lead-out wire 324.

Furthermore, here, the shape of the lead-out wire 324 has been described in detail, but the first terminal portion 324T, which is a part of the lead-out wire 324, also has the same shape as the shape of the lead-out wire 324 described above. Therefore, the detailed description of the shape of the first terminal portion 324T will be omitted.

The resin layer 33 of this embodiment is configured of a UV curable resin such as an epoxy resin, an acrylic resin, a polyester resin, a urethane resin, a vinyl resin, a silicone resin, a phenolic resin, and a polyimide resin, a thermosetting resin or a thermoplastic resin, ceramics, and the like. The resin layer 33 of this embodiment corresponds to an example of the second resin layer of the invention.

As illustrated in FIG. 4 to FIG. 6, the resin layer 33 includes a main portion 331 including approximately a smooth upper surface and is disposed on the main surface 21 of the substrate 2, and a protrusion 332 disposed on the main portion 331. As illustrated in FIG. 4 or FIG. 5, the main portion 331 covers the first conductor layer 32 and the adhesive layer 31 except for an adhesive surface with respect to the first electrode pattern 320. In addition, as illustrated in FIG. 1, in a terminal region 333 for connection to an external terminal (not illustrated), the first terminal portion 324T and a second terminal portion 344T (described below) are exposed to the outside of the wiring board 1. The protrusion 332 protrudes towards the second conductor layer 34 side (the +Z axis direction side), and is formed corresponding to a second electrode pattern 340 of the second conductor layer 34. The main portion 331 and the protrusion 332 of the resin layer 33 of this embodiment are integrally configured. The protrusion 332 of this embodiment corresponds to an example of a second protrusion of the invention.

As illustrated in FIG. 6, a sectional shape of the protrusion 332 of this embodiment (a sectional shape in an extending direction of a second conductor wire 342 (described below)) is a shape which narrows towards a direction separated from the substrate 2 (an upper direction in FIG. 6). In addition, a boundary between the protrusion 332 and the second conductor wire 342 has a concave-convex shape corresponding to a concave-convex shape of a lower surface 346 of the second conductor wire 342. The protrusion 332 is disposed on the main portion 331, and thus, the rigidity of the second conductor wire 342 in the protrusion 332 is improved. Such a concave-convex shape of the lower surface 346 is formed on the basis of the surface roughness of the lower surface 346 of the second conductor wire 342. Furthermore, as illustrated in FIG. 4, the boundary between the protrusion 332 and the second conductor wire 342 in the sectional surface along the extending direction of the second conductor wire 342 also has a concave-convex shape corresponding to the concave-convex shape of the lower surface 346 of the second conductor wire 342. The surface roughness of the lower surface 346 will be described below in detail. In FIG. 4 and FIG. 6, in order to describe the wiring body 3 of this embodiment to be easily understood, the concave-convex shape of the boundary between the protrusion 332 and the second conductor wire 342 is exaggeratingly illustrated.

In addition, in this embodiment, as illustrated in FIG. 9, a thickness (a maximum thickness) $W_1$ of the resin layer 33 is greater than a thickness (a maximum thickness) $W_2$ of the first conductor layer 32. Accordingly, it is possible to ensure the insulation between the first conductor layer 32 and the second conductor layer 34. In addition, in this embodiment, the thickness (the maximum thickness) $W_1$ of the resin layer 33 is a thickness (a maximum thickness) $W_3$ of the adhesive layer 31.

Furthermore, the thickness (the maximum thickness) described above is an average maximum thickness. Here, the average maximum thickness is obtained by sampling sectional surfaces of each conductor wire along a width direction over the entire extending direction of the conductor wire, and by averaging maximum values of thicknesses obtained in each of the sectional surfaces. Incidentally, the conductor wire described above includes the first conductor wires 321 and 322 and the lead-out wire 324 (first terminal portion 324T) which configure the first conductor layer 32, and the second conductor wires 341 and 342 and lead-out wire 344 (the second terminal portion 344T) which configure the second conductor layer 34. The conductor wire described above is suitably selected according to a parameter to be required.

In the case of obtaining the thickness (the maximum thickness) $W_1$ of the resin layer 33, a maximum value of the thickness of the resin layer 33 is a distance between a contact portion (an adhesive surface) with respect to a lower surface 348 of the second terminal portion 344T in the resin layer 33 corresponding to the second terminal portion 344T and a lower surface of the resin layer 33 along the Z axis direction. In this embodiment, the lower surface of the resin layer 33 is a contact portion with respect to an upper surface of the adhesive layer 31, but in a case where the adhesive layer 31 is not included, the lower surface of the resin layer 33 is a contact surface with respect to the main surface 21 of the substrate 2.

In addition, in the case of obtaining the thickness (the maximum thickness) $W_2$ of the first conductor layer 32, a maximum value of the thickness of the first conductor layer 32 is a distance between the lower surface 328 and the upper surface 329 of first terminal portion 324T (the lead-out wire 324) along the Z axis direction.

In addition, in the case of obtaining the thickness (the maximum thickness) $W_3$ of the adhesive layer 31a, a maximum value of the thickness of the adhesive layer 31 is a distance between a contact portion (a contact surface) with respect to the lower surface 328 of the of the first terminal portion 324T in the adhesive layer 31 corresponding to the first terminal portion 324T and a lower surface of the adhesive layer 31 (a contact portion with respect to the main surface 21 of the substrate 2) along the Z axis direction.

The second conductor layer 34, for example, is a layer which functions as an electrode or a lead-out wire, and is configured of the same conductive material as that of the first conductor layer 32. As illustrated in FIG. 3, the second conductor layer 34 of this embodiment is directly disposed on the resin layer 33, and includes the second electrode pattern 340 extending along an X axis direction in FIG. 3, and the lead-out wire 344 connected to the second electrode pattern 340. In this embodiment, four second electrode patterns 340 are arranged approximately at regular intervals along a Y axis direction in FIG. 3. In this embodiment, two second electrode patterns 340 arranged on a +Y axis direction side in FIG. 3 are connected to the lead-out wire 344 on a −X axis direction side in FIG. 3, and two second electrode patterns 340 arranged on a −Y axis direction side in FIG. 3 are connected to the lead-out wire 344 on a +X axis direction side in FIG. 3. Furthermore, the number and the arrangement of second electrode patterns included in the second conductor layer 34 are not particularly limited to the above description.

The second electrode pattern 340 includes second conductor wires 341 and 342. As illustrated in FIG. 3, the second conductor wire 341 linearly extends, and the second conductor wire 342 also linearly extends. In addition, the second conductor wires 341 are arranged in parallel with each other approximately at regular intervals, and the second conductor wires 342 are also arranged in parallel with each other approximately at regular intervals. In this embodiment, the second conductor wire 341 and the second conductor wire 342 are orthogonal to each other, and thus, the second electrode pattern 340 is in the shape of a mesh having a rectangular lattice. Furthermore, in this embodiment, the shape of a unit lattice configuring the mesh-like shape of the first electrode pattern 320 and the shape of a unit lattice configuring the mesh-like shape of the second electrode pattern 340 are approximately identical to each other, but are not particularly limited thereto.

In this embodiment, the second conductor wires 341 and 342 are arranged by being respectively inclined at 45 degrees with respect to an extending direction of the second electrode pattern 340 (the X axis direction in FIG. 3), and may be arranged by being respectively inclined at other angles (for example, 30 degrees). In addition, one of the second conductor wires 341 and 342 may be disposed by being inclined at 90 degrees with respect to the extending direction of the second electrode pattern 340 (the X axis direction in FIG. 3).

Furthermore, the second conductor wires 341 and 342 may extend into the shape of a curve, a horseshoe, a zigzag line, and the like, or a linear portion and portions in the shape of a curve, a horseshoe, a zigzag line, and the like may be mixed. In addition, an angle between the second conductor wire 341 and the second conductor wire 342 is not particularly limited to a right angle. In this embodiment, the second conductor wires 341 and 342 have wire widths which are approximately identical to each other, but the second conductor wires 341 and 342 may have wire widths which are different from each other. It is possible to set the width of the second conductor wires 341 and 342 to be in the same range as the range of the width of the first conductor wires 321 and 322 described above.

Furthermore, the shape of each reticulation of a mesh configured of the second conductor wires 341 and 342 is not particularly limited. For example, each of the reticulations may be in the shape of a geometrical pattern as described below. That is, the reticulation of the mesh configured of the second conductor wires 341 and 342 may be in the shape of a triangle such as an equilateral triangle, an isosceles triangle, and a right triangle, or may be in the shape of a quadrangle such as a parallelogram and a trapezoid. In addition, the reticulation may be in the shape of an n-polygon such as a hexagon, an octagon, a dodecagon, and an icosagon, a circle, an ellipse, a star, or the like.

In this embodiment, a side portion 340a of the second electrode pattern 340, which is connected to the lead-out wire 344, is wider than the second conductor wires 341 and 342. Even though it is not particularly illustrated, a frame portion surrounding at least a part of the mesh-like shape formed of the second conductor wires 341 and 342 may include the second electrode pattern 340. In this embodiment, the second conductor wires 341 and 342, the side portion 340a, and the lead-out wire 344 are integrally formed. A tip portion of the lead-out wire 344 is formed of the second terminal portion 344T (refer to FIG. 1) connected to an external terminal (not illustrated) and the like.

As illustrated in FIG. 6, a side portion 343 of the second conductor wire 342 and a side portion of the protrusion 332 of the resin layer 33 are smoothly continuous, and thus, form one flat surface. The second conductor wire 342 has a tapered shape which narrows towards a side separated from the first conductor layer (the upper direction side in FIG. 6), and thus, a sectional surface of the second conductor wire 342 (a sectional surface of the second conductor wire 342 in the extending direction) is approximately in the shape of a trapezoid. Furthermore, the sectional shape of the second conductor wire 342 is not particularly limited thereto. For example, the sectional surface of the second conductor wire 342 may be in the shape of a square, a rectangle, a triangle, and the like. Furthermore, in this embodiment, the second conductor wire 341 also has the same sectional shape as that of the second conductor wire 342.

In FIG. 6, the lower surface 346 of the second conductor wire 342 of this embodiment is an adhesive surface adhering to the support portion 332. On the other hand, an upper surface 345 is positioned on a side opposite to the lower surface 346 of the second conductor wire 342. The upper surface 345 is substantially parallel to the main surface 21 of the substrate 2 (an upper surface of the main portion 331 of the resin layer 33).

The upper surface 345 includes a flat portion 3451 in the sectional surface of the second conductor wire 342 in a width direction. The flat portion 3451 is a linear portion existing in the upper surface 345 (that is, a portion having a maximum curvature radius), in the sectional surface of the second conductor wire 342 in the width direction, and has a flatness of less than or equal to 0.5 μm. Furthermore, the flatness can be defined by a JIS method (JIS B0621 (1984)). The flatness of the flat portion 3451 can be measured by the same method as the measurement method of the flatness of the flat portion 3251.

The flat portion 3451 of this embodiment is formed approximately on the entire upper surface 345. Furthermore, the flat portion 3451 may be formed on a part of the upper surface 345, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The side portion 343 is positioned between the upper surface 345 and the lower surface 346. The side portion 343 is connected to the upper surface 345 in a first portion 3431, and is connected to the lower surface 346 in a second portion 3432. The second conductor wire 352 of this embodiment has a tapered shape which narrows towards a side separated from the first conductor layer 32, and thus, the second portion 3432 is positioned on the outside from the first portion 3431. The side portion 343 of this embodiment is a linear surface extending on a virtual straight line (not illustrated) which passes through the first portion 3431 and the second portion 3432, in the sectional surface of the second conductor wire 342 in the width direction.

Furthermore, the shape of the side portion 343 is not particularly limited to the above description. For example, the side portion 343 may protrude to the outside from the virtual straight line which passes through the first portion 3431 and the second portion 3432, in the sectional surface of the second conductor wire 342 in the width direction. Thus, it is preferable that the side portion 343 has a shape which is not recessed to the inside from the virtual straight line passing through the first portion and the second portion (a shape in which the bottom of the second conductor wire 342 does not widen), in the sectional surface of the second conductor wire 342 in the width direction.

The side portion 343 of this embodiment includes a flat portion 3433 in the sectional surface of the second conductor wire 342 in the width direction. The flat portion 3433 is a linear portion existing in the side portion 343 (that is, a portion having a maximum curvature radius), in the sectional surface of the second conductor wire 342 in the width direction, and has a flatness of less than or equal to 0.5 μm. The flatness of the flat portion 3433 can be measured by the same method as the measurement method of the flatness of the flat portion 3251 described above. In this embodiment, the flat portion 3433 is formed approximately in the entire side portion 343. Furthermore, the shape of the flat portion 3433 is not particularly limited to the above description, and the flat portion 3433 may be formed in a part of the side portion 343. Furthermore, in one second conductor wire 342, an angle between one side portion 343 and the upper surface 345 and an angle between the other side portion 343 and the upper surface 345 may be different from each other.

An angle $\theta_3$ between the side portion 343 and the upper surface 345 is preferably within a range of 90° to 170° ($90° \leq \theta_3 \leq 170°$), and is more preferably within a range of 90° to 120° ($90° \leq \theta_3 \leq 120°$), from the viewpoint of suppressing the diffuse reflection of light on the side portion 343. In this embodiment, in one second conductor wire 342, the angle between one side portion 343 and the upper surface 345 and the angle between the other side portion 343 and the upper surface 345 are substantially identical to each other.

In this embodiment, it is preferable that the surface roughness of the lower surface 346 of the second conductor wire 342 in FIG. 6 is rougher than the surface roughness of the upper surface 345 of the second conductor wire 342 in FIG. 6, from the viewpoint of increasing a contact area between the second conductor wire 342 and the resin layer 33, and of rigidly fixing the second conductor wire 342 to the resin layer 33. In this embodiment, the upper surface 345 includes the flat portion 3451, and thus, a relative relationship of the surface roughness of the second conductor wire 342 described above (a relationship in which the surface roughness of the lower surface 346 is relatively rougher than the surface roughness of the upper surface 345) is established. Specifically, it is preferable that the surface roughness Ra of the lower surface 346 of the second conductor wire 342 is within a range of 0.1 μm to 3 μm, whereas the surface roughness Ra of the upper surface 345 is within a range of 0.001 μm to 1.0 μm. Furthermore, it is more preferable that the surface roughness Ra of the lower surface 346 of the second conductor wire 342 is within a range of 0.1 μm to 0.5 μm, and it is more preferable that the surface roughness Ra of the upper surface 345 is within a range of 0.001 μm to 0.3 μm. In addition, a ratio of the surface roughness of the upper surface 345 to the surface roughness of the lower surface 346 (the surface roughness of the upper surface 345 with respect to the surface roughness of the lower surface 346) is preferably greater than or equal to 0.01 and less than 1, and is more preferably greater than or equal to 0.1 and less than 1. In addition, it is preferable that the surface roughness of the upper surface 345 is less than or equal to ⅕ of the width (a maximum width) of the second conductor wire 342. Furthermore, such surface roughness can be measured by a JIS method (JIS B0601 (revised on Mar. 21, 2013)). The surface roughness of the lower surface 346 and the surface roughness of the upper surface 345 may be measured along the width direction of the second conductor wire 342, or may be measured along the extending direction of the second conductor wire 342.

In addition, in this embodiment, the side portion 343 also includes the flat portion 3433. Then, as with the upper surface 345, the surface roughness of the lower surface 346 is rougher than the surface roughness of the side portion 343 including the flat portion 3433. Specifically, it is preferable that the surface roughness Ra of the side portion 343 is within a range of 0.001 μm to 1.0 μm, with respect to the surface roughness Ra of the lower surface 346 described above. Furthermore, it is more preferable that the surface roughness Ra of the side portion 343 is within a range of 0.001 μm to 0.3 μm. The surface roughness of the side portion 343 may be measured along the width direction of the second conductor wire 342, or may be measured along the extending direction of the second conductor wire 342.

In this embodiment, the upper surface 345 includes the flat portion 3451, and the side portion 343 includes the flat portion 3433. In this case, it is preferable that the diffuse reflectance of the wiring body 3 on a side of a surface except for the lower surface 346 (that is, the side of the surface including the upper surface 345 and the side portion 343) is relatively smaller than the diffuse reflectance of the wiring body 3 on a side of the lower surface 346. Specifically, a ratio of the diffuse reflectance of the wiring body 3 on the side of the surface except for the lower surface 346 to the diffuse reflectance of the wiring body 3 on the side of the lower surface 346 (the diffuse reflectance of the wiring body 3 on the side of the surface except for the lower surface 346 with respect to the diffuse reflectance of the wiring body 3 on the side of the lower surface 346) is preferably greater than or equal to 0.1 and less than 1, and is more preferably greater than or equal to 0.3 and less than 1.

As illustrated in FIG. 8, the lead-out wire 344 and the resin layer 33 in a portion corresponding to the lead-out wire 344 respectively have the same sectional shapes as those of the second conductor wire 342 and the resin layer 33 adhering to the second conductor wire 342.

That is, the resin layer 33 includes the main portion 331 and the protrusion 332, and the lead-out wire 344 is disposed on the protrusion 332. The side portion 347 of the lead-out wire 344 and the side portion of the protrusion 332 of the resin layer 33 are smoothly continuous, and thus, form one flat surface. The lead-out wire 344 has a tapered shape which narrows towards a side separated from the resin layer 33 (the +Z axis direction side in FIG. 8), and thus, a sectional shape of the lead-out wire 344 (a sectional shape of the lead-out wire 344 in an extending direction) is approximately in the shape of a trapezoid. Furthermore, the sectional shape of the lead-out wire 344 is not particularly limited thereto. For example, the sectional surface of the lead-out wire 344 may be in the shape of a square, a rectangle, a triangle, and the like.

The lead-out wire 344 of this embodiment is configured of substantially the same material as the material configuring the second electrode pattern 340, and the second electrode pattern 340 and the lead-out wire 344 are integrally formed.

In FIG. 8, the lower surface 348 of the lead-out wire 344 of this embodiment is an adhesive surface adhering to the support portion 332. On the other hand, an upper surface 349 is positioned on a side opposite to the lower surface 348 in the lead-out wire 344. The upper surface 349 is substantially parallel to the main surface 21 of the substrate 2 (the upper surface of the main portion 331 of the resin layer 33).

The upper surface 349 includes a flat portion 3491 in the sectional surface of the lead-out wire 344 in a width direction. The flat portion 3491 is a linear portion existing in the upper surface 349 (that is, a portion having a maximum curvature radius), in the sectional surface of the lead-out wire 344 in the width direction, and has a flatness of less than or equal to 0.5 µm. Furthermore, the flatness can be defined by a JIS method (JIS B0621 (1984)). The flatness of the flat portion 3491 can be measured by using the same method as the measurement method of the flatness of the flat portion 3251.

The flat portion 3491 of this embodiment is formed approximately on the entire upper surface 349. Furthermore, the flat portion 3491 may be formed on a part of the upper surface 349, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The side portion 347 is positioned between the upper surface 349 and the lower surface 348. The side portion 347 is connected to the upper surface 349 in a first portion 3471, and is connected to the lower surface 348 in a second portion 3472. The lead-out wire 344 of this embodiment has a tapered shape which narrows towards a side separated from the first conductor layer 32, and thus, the second portion 3472 is positioned on the outside from the first portion 3471. The side portion 347 of this embodiment is a linear surface extending on a virtual straight line (not illustrated) which passes through the first portion 3471 and the second portion 3472, in the sectional surface of the lead-out wire 344 in the width direction.

Furthermore, the shape of the side portion 347 is not particularly limited to the above description. For example, the side portion 347 may protrude to the outside from the virtual straight line which passes through the first portion 3471 and the second portion 3472, in the sectional surface of the lead-out wire 344 in the width direction. Thus, it is preferable that the side portion 347 has a shape which is not recessed to the inside from the virtual straight line passing through the first portion and the second portion (a shape in which the bottom of the lead-out wire 344 does not widen), in the sectional surface of the lead-out wire 344 in the width direction.

The side portion 347 of this embodiment includes a flat portion 3473 in the sectional surface of the lead-out wire 344 in the width direction. The flat portion 3473 is a linear portion existing in the side portion 347 (that is, a portion having a maximum curvature radius), in the sectional surface of the lead-out wire 344 in the width direction, and has a flatness of less than or equal to 0.5 µm. The flatness of the flat portion 3473 can be measured by the same method as the measurement method of the flatness of the flat portion 3251 described above. In this embodiment, the flat portion 3473 is formed approximately in the entire side portion 347. Furthermore, the shape of the flat portion 3437 is not particularly limited to the above description, and the flat portion 3437 may be formed in a part of the side portion 347.

An angle $\theta_4$ between the side portion 347 and the upper surface 349 is preferably within a range of 90° to 170° ($90° \leq \theta_4 \leq 170°$), and is more preferably within a range of 90° to 120° ($90° \leq \theta_4 \leq 120°$). In this embodiment, in one lead-out wire 344, an angle between one side portion 347 and the upper surface 349 and an angle between the other side portion 347 and the upper surface 349 are substantially identical to each other. Furthermore, in one lead-out wire 344, the angle between one side portion 347 and the upper surface 349 and the angle between the other side portion 347 and the upper surface 349 may be different from each other.

In this embodiment, it is preferable that the surface roughness of the lower surface (a second adhesive surface) 348 of the lead-out wire 344 in FIG. 8 is rougher than the surface roughness of the upper surface 349 of the lead-out wire 344 in FIG. 8, from the viewpoint of rigidly fixing the lead-out wire 344 to the resin layer 33. In this embodiment, the upper surface 349 includes the flat portion 3491, and thus, a relative relationship of the surface roughness of the lead-out wire 344 described above (a relationship in which the surface roughness of the lower surface 348 is relatively rougher than the surface roughness of the upper surface 349) is established. Specifically, it is preferable that the surface roughness Ra of the lower surface 348 of the lead-out wire 344 is within a range of 0.1 µm to 3 µm, whereas the surface roughness Ra of the upper surface 349 is within a range of 0.001 µm to 1.0 µm. Furthermore, it is more preferable that the surface roughness Ra of the lower surface 348 of the lead-out wire 344 is within a range of 0.1 µm to 0.5 µm, and it is more preferable that the surface roughness Ra of the upper surface 349 is within a range of 0.001 µm to 0.3 µm. In addition, a ratio of the surface roughness of the upper surface 349 to the surface roughness of the lower surface 348 (the surface roughness of the upper surface 349 with respect to the surface roughness of the lower surface 348) is preferably greater than or equal to 0.01 and less than 1, and is more preferably greater than or equal to 0.1 and less than 1. In addition, it is preferable that the surface roughness of the upper surface 349 is less than or equal to ⅕ of the width (a maximum width) of the lead-out wire 344. Furthermore, such surface roughness can be measured by a JIS method (JIS B0601 (revised on Mar. 21, 2013)). The surface roughness of the lower surface 348 and the surface roughness of the upper surface 349 may be measured along the width direction of the lead-out wire 344, or may be measured along the extending direction of the lead-out wire 344.

In addition, in this embodiment, the side portion 347 also includes the flat portion 3473. Then, as with the upper surface 349, the surface roughness of the lower surface 348 is rougher than the surface roughness of the side portion 347 including the flat portion 3473. Specifically, it is preferable that the surface roughness Ra of the side portion 347 is within a range of 0.001 µm to 1.0 µm, with respect to the surface roughness Ra of the lower surface 348 described above. Furthermore, it is more preferable that surface roughness Ra of the side portion 347 is within a range of 0.001 µm to 0.3 µm. The surface roughness of the side portion 347 may be measured along the width direction of the lead-out wire 344, or may be measured along the extending direction of the lead-out wire 344.

Furthermore, here, the shape of the lead-out wire 344 has been described in detail, but the second terminal portion 344T, which is a part of the lead-out wire 344, also has the same shape as that of the lead-out wire 344 described above. Therefore, the detailed description of the shape of the second terminal portion 344T will be omitted.

In addition, as described above, in the terminal region 333, as illustrated in FIG. 9, the first terminal portion 324T and the second terminal portion 344T are exposed to the outside of the wiring board 1. In addition, in the terminal region 333, the resin layer 33 is disposed only in a portion corresponding to the lead-out wire 344. For this reason, the first terminal portion 324T and the second terminal portion 344T are shifted from each other along a thickness direction of the adhesive layer 31 (a Z axis direction in FIG. 9) by a distance R. That is, a distance between an average position along the thickness direction of the adhesive layer 31 (the Z axis direction in FIG. 9) in the first terminal portion 324T and an average position along the thickness direction of the adhesive layer 31 (the Z axis direction in FIG. 9) in the second terminal portion 344T is R. Furthermore, in this embodiment, a space between the adjacent second terminal portions 344T is covered with the resin layer 33, and a non-forming portion of the resin layer 33 may be disposed between the adjacent second terminal portions 344T.

The first terminal portion 324T protrudes towards a side separated from the adhesive layer 31 in the Z axis direction. In this case, in a case observing the sectional surface of the wiring body 3 along an X axis direction (a direction orthogonal to an extending direction of the first terminal portion 324T), the entire first terminal portion 324T is positioned on the side separated from the adhesive layer 31 from the lower surface of the resin layer 33 (a surface on a side opposite to a surface on which the second conductor layer is disposed) in the Z axis direction. In this embodiment, the first terminal portion 324T is exposed without being covered with the resin layer 33, but in a case where the first terminal portion 324T is projected in the X axis direction, the entire projection portion of the first terminal portion 324T overlaps with the resin layer 33. Furthermore, a positional relationship between the first terminal portion 324T and the resin layer 33 is not particularly limited to the above description, but in a case where the first terminal portion 324T is projected in the X axis direction, a part of the first terminal portion 324T may overlap with the resin layer 33.

Furthermore, in the terminal region 333, a side surface of the resin layer 33 disposed only in the portion corresponding to the lead-out wire 344 on the first terminal portion 324T side is approximately a vertical surface, but is not particularly limited thereto. For example, as illustrated in FIG. 10, a thin portion 334 may be formed in which the side surface of the resin layer 33 on the first terminal portion 324T side gradually becomes thin towards the first terminal portion 324T side. In this case, it is possible to prevent air bubbles from entering between a connector and the first terminal portion 324T and the second terminal portion 344T, at the time of connecting the first terminal portion 324T and the second terminal portion 344T to the connector (not illustrated). In addition, a step between the first terminal portion 324T and the second terminal portion 344T is reduced due to the existence of the thin portion 334, and thus, it is possible to easily connect the first terminal portion 324T and the second terminal portion 344T to the connector, and to improve the durability of the connection portion.

In addition, in this embodiment, the resin layer 33 disposed only in the portion corresponding to the lead-out wire 344 has approximately a constant thickness in the terminal region 333, but is not particularly limited thereto. For example, as illustrated in FIG. 11, the thickness of the resin layer 33 disposed only in the portion corresponding to the lead-out wire 344 may relatively decrease in the tip portion of the lead-out wire 344 (the terminal portion 344T) in the extending direction (a −Y axis direction in FIG. 11).

In the touch sensor 10 of this embodiment, the wiring board 1 described above is connected to a driving circuit C through the lead-out wire 324 and the lead-out wire 344. The driving circuit C, for example, periodically applies a predetermined voltage between the first electrode pattern 320 and the second electrode pattern 340, and determines a contact position of a finger of an operator in the touch sensor 10, on the basis of a change in electrostatic capacitance at each intersection point between the first electrode pattern 320 and the second electrode pattern 340.

Next, a manufacturing method of the wiring board 1 of this embodiment will be described. FIG. 12(A) to FIG. 12(I) are sectional views for describing the manufacturing method of the wiring board 1 of this embodiment, and FIG. 13(A) to FIG. 13(I) are sectional views for describing a modification example of the manufacturing method of the wiring board 1 of this embodiment. Furthermore, in the example of FIG. 13(A) to FIG. 13(I), a case where the second terminal portion 344T is disposed on the outside of each of two terminal portions of the first terminal portion 324T and the first terminal portion 324T is illustrated.

First, as illustrated in FIG. 12(A), a first intaglio 4 is prepared on which the first electrode pattern 320 of the first conductor layer 32 and a recessed portion 41 having a shape corresponding to the shape of the lead-out wire 324 are formed. Glasses such as nickel, silicon, and silicon dioxide, organic silicas, glassy carbon, a thermoplastic resin, a photocurable resin, and the like can be exemplified as a material configuring the first intaglio 4. The width of the recessed portion 41 is preferably within a range of 50 nm to 1000 µm, is more preferably within a range of 500 nm to 150 µm, is even more preferably within a range of 1 µm to 10 µm, and is still even more preferably within a range of 1 µm to 5 µm. In addition, the depth of the recessed portion 41 is preferably within a range of 50 nm to 3000 µm, is more preferably within a range of 500 nm to 450 µm, and is even more preferably within a range of 500 nm to 10 µm. In this embodiment, a sectional shape of the recessed portion 41 is a tapered shape which narrows towards a bottom portion.

In order to improve releasability, it is preferable that a release layer 411 formed of a black lead-based material, a silicone-based material, a fluorine-based material, a ceramic-based material, an aluminum-based material, and the like, is formed on a front surface of the recessed portion 41.

The recessed portion 41 of the first intaglio 4 described above is filled with a conductive material 5. The conductive paste as described above is used as such a conductive material 5. Examples of a method of filling the recessed portion 41 of the first intaglio 4 with the conductive material 5 are capable of including a dispense method, an ink jet method, and a screen printing method. Alternatively, a method in which coating is performed by a slit coating method, a bar coating method, a blade coating method, a dip coating method, a spray coating method, and a spin coating method, and then, the conductive material applied onto a portion other than the concave portion is wiped away or scraped away, is absorbed, is pasted, is washed, and is blown away, can be included. The composition or the like of the conductive material can be suitably changed according to the shape or the like of the intaglio plate.

Next, as illustrated in FIG. 12(B), the conductive material 5 filled in the recessed portion 41 of the first intaglio 4 is heated, and thus, a conductive pattern configuring the first conductor layer 32 is formed. Heating conditions of the conductive material 5 can be suitably set according to the composition or the like of the conductive material. By such a heating treatment, the conductive material 5 is subjected to volume contraction. At this time, an outer surface of the conductive material 5 except for an upper surface is formed to have a shape along the recessed portion 41. On the other hand, an upper surface of the conductive pattern is heated in a state of being in contact with an external atmosphere, and thus, a concave-convex shape 51 is formed on the basis of the shape of the conductive material contained in the conductive material 5 (refer to the extracted drawing in FIG. 12(B)). Furthermore, a treatment method of the conductive material 5 is not limited to the heating. The conductive material 5 may be irradiated with an energy ray such as an infrared ray, an ultraviolet ray, and laser light, or may only be dried. In addition, two or more types of treatment methods may be combined. It is possible to increase a contact area between the first conductor layer 32 and the adhesive layer 31, and to more rigidly fix the first conductor layer 32 to the adhesive layer 31, due to the existence of the concave-convex shape 51.

Subsequently, as illustrated in FIG. 12(C), an adhesive material 6 for forming the adhesive layer 31 is approximately evenly applied onto the substrate 2. The material configuring the adhesive layer 31 described above is used as such an adhesive material 6. A screen printing method, a spray coating method, a bar coating method, a dip method, an ink jet method, and the like can be exemplified as a method of applying the adhesive material 6 onto the substrate 2.

Next, as illustrated in FIG. 12(D), the substrate 2 and the adhesive material 6 are arranged on the first intaglio 4 such that the adhesive material 6 inserted to the recessed portion 41 of the first intaglio 4, the substrate 2 is pressed against the first intaglio 4, and the adhesive material 6 is hardened. Irradiating of an energy ray such as an ultraviolet ray, an infrared ray, and laser light, heating, heating and cooling, drying, and the like can be exemplified as a method of hardening the adhesive material 6. Accordingly, the adhesive layer 31 is formed, and the substrate 2 and the first conductor layer 32 adhere and are fixed to each other through the adhesive layer 31.

Subsequently, as illustrated in FIG. 12(E), the substrate 2, the adhesive layer 31, and the first conductor layer 32 are released from the first intaglio 4, and thus, an intermediate 7 is obtained.

Subsequently, as illustrated in FIG. 12(F), a second intaglio 45 is prepared on which the second electrode pattern 340 of the second conductor layer 34 and a recessed portion 46 having a shape corresponding to the shape of the lead-out wire 344 are formed. Examples of a material configuring the second intaglio 45 are capable of including the same material as that of the first intaglio 4 described above. In this embodiment, a sectional shape of the recessed portion 46 is a tapered shape which narrows towards a bottom portion. Furthermore, it is preferable that a release layer 461, which is identical to the release layer 411 of the recessed portion 41, is formed on a front surface of the recessed portion 46.

The recessed portion 46 of the second intaglio 45 described above is filled with a conductive material. Examples of the conductive material filled in the recessed portion 46 are capable of including the same material as the conductive material 5 described above.

Examples of a method of filling the recessed portion 46 of the second intaglio 45 with the conductive material are capable of including a dispense method, an ink jet method, and a screen printing method. Alternatively, a method in which coating is performed by a slit coating method, a bar coating method, a blade coating method, a dip coating method, a spray coating method, and a spin coating method, and then, the conductive material applied onto a portion other than the concave portion is wiped away or scraped away, is absorbed, is pasted, is washed, and is blown away, can be included. The composition or the like of the conductive material can be suitably changed according to the shape or the like of the intaglio plate.

Next, the conductive material filled in the recessed portion 46 of the second intaglio 45 is heated, and thus, a conductive pattern configuring the second conductor layer 34 is formed. Heating conditions of the conductive material can be suitably set according to the composition or the like of the conductive material. By such a heating treatment, the conductive material filled in the recessed portion 46 is subjected to volume contraction, and an outer surface of the conductive material except for an upper surface is formed to have a shape along the recessed portion 46. On the other hand, the same concave-convex shape as the concave-convex shape 51 is formed on an upper surface of the conductive pattern. Furthermore, the treatment method of the conductive material is not limited to the heating. The conductive material may be irradiated with an energy ray such as an infrared ray, an ultraviolet ray, and laser light, or may only be dried. In addition, two or more types of treatment methods may be combined. The same concave-convex shape as the concave-convex shape 51 is formed on the conductive pattern, and thus, it is possible to increase a contact area between the second conductor layer 34 and the resin layer 33, and to more rigidly fix the second conductor layer 34 to the resin layer 33.

Subsequently, as illustrated in FIG. 12(F), a resin material 71 configuring the resin layer 33 is applied onto the second intaglio 45. The material configuring the resin layer 33 described above is used as such a resin material 71. Furthermore, it is preferable that the viscosity of the material configuring the resin layer 33 is 1 mPa·s to 10,000 mPa·s, from the viewpoint of ensuring sufficient fluidity at the time of performing coating. In addition, a storage elastic modulus of the resin after being hardened is preferably less than or equal to $10^6$ Pa, and is more preferably less than or equal to $10^9$ Pa, from the viewpoint of the durability of the first conductor layer 32 or the second conductor layer 34. A screen printing method, a spray coating method, a bar coating method, a dip method, an ink jet method, and the like can be exemplified as a method of applying the resin material 71 onto the second intaglio 45.

Next, the intermediate 7 and the resin material 71 are arranged on the second intaglio 45 such that the resin material 71 is inserted to the recessed portion 46 of the second intaglio 45, the intermediate 7 is pressed against the second intaglio 45, and the resin material 71 is hardened (refer to FIG. 12(G) and FIG. 12(H)). Irradiating of an energy ray such as an ultraviolet ray, an infrared ray, and laser light, heating, heating and cooling, drying, and the like can be exemplified as a method of hardening the resin material 71. A pressurizing force at the time of pressing the intermediate 7 against the second intaglio 45 is preferably within a range of 0.001 MPa to 100 MPa, and is more preferably within a range of 0.01 MPa to 10 MPa. Furthermore, the pressurization can be performed by using a pressurizing roller or the like. Accordingly, the resin layer 33 is formed, and the intermediate 7 and the second conductor layer 34 adhere and are fixed to each other through the resin layer 33.

Then, the intermediate 7, the resin layer 33, and the second conductor layer 34 are released from the second intaglio 45, and thus, the wiring board 1 including the wiring body 3 of this embodiment can be obtained (refer to FIG. 12(I)). Furthermore, the process sequence described above is not particularly limited to the above description.

For example, the wiring board 1 may be manufactured by a method described below. That is, as illustrated in FIG. 13(A) to FIG. 13(I), the first intaglio 4 is filled with the conductive material 5 (FIG. 13(A)) and is heated (FIG. 13(B)), and then, a resin material is applied onto the first intaglio 4 (FIG. 13(C)), and the resin material is solidified (FIG. 13(D)). Then, a wiring body or a wiring board may be configured by using the solidified resin material as a base material (FIG. 13(E) to FIG. 13(I)).

Next, the function of the wiring board 1 including the wiring body 3 and the touch sensor of this embodiment will be described.

In the wiring body 3 of this embodiment, the first conductor layer 32 is formed on the adhesive layer 31, and the second conductor layer 34 is formed n the resin layer 33. Then, the first terminal portion 324T of the first conductor layer 32 and the second terminal portion 344T of the second conductor layer are shifted from each other along the thickness direction of the adhesive layer 31 (a Z axis direction in FIG. 8). Accordingly, it is possible to dispose the terminal portions 324T and 344T, which are exposed in the same direction without using an anisotropic conductive adhesive agent, and thus, it is possible to improve the lead-out properties of wiring.

In addition, in this embodiment, in a case where the first terminal portion 324T protrudes towards a side separated from the adhesive layer 31 in the Z axis direction, and the first terminal portion 324T is projected in the X axis direction, the projection portion of the first terminal portion 324T overlaps with the resin layer 33. For this reason, it is possible to decrease a distance between the first terminal portion 324T and the second terminal portion 344T, and thus, it is possible to easily extract the first terminal portion 324T and the second terminal portion 344T.

In addition, in this embodiment, the positional relationship between the first terminal portion 324T and the resin layer 33 is the positional relationship described above (a relationship in which at least a part of the projection portion of the first terminal portion 324T overlaps with the resin layer 33 in a case where the first terminal portion 324T is projected in the X axis direction), and thus, it is possible to arrange the first terminal portion 324T and the second terminal portion 344T in a state of being close to each other. For this reason, it is possible to improve the durability of a connection portion between the first terminal portion 324T and the second terminal portion 344T and an external connector (not illustrated).

In addition, in this embodiment, an optical transparent adhesive material or the like is not interposed between the resin layer 33, and the first conductor layer 32 and the adhesive layer 31. For this reason, it is possible to reduce the total thickness of the wiring body 3, the wiring board 1, and the touch sensor 10 including the wiring body 3 and the wiring board 1.

In addition, in the wiring body 3 of this embodiment, as illustrated in FIG. 9, the thickness (the maximum thickness) $W_1$ of the resin layer 33 is greater than the thickness (the maximum thickness) $W_2$ of the first conductor layer 32. Accordingly, it is possible to ensure the insulation between the first conductor layer 32 and the second conductor layer 34. For this reason, it is possible to dispose both of the first electrode pattern 320 and the second electrode pattern 340 on one main surface of the substrate 2, and thus, it is possible to thin the wiring body 3, the wiring board 1, and the touch sensor 10 including the wiring body 3 and the wiring board 1.

In addition, in this embodiment, the first electrode pattern 320 and the lead-out wire 324 are integrally formed, and the second electrode pattern 340 and the lead-out wire 344 are integrally formed. For this reason, it is possible to improve the connection reliability between the first electrode pattern 320 and the lead-out wire 324, and the connection reliability between the second electrode pattern 340 and the lead-out wire 344.

In addition, at this time, as described with reference to FIG. 11, in a case where the thickness of the resin layer 33 disposed only in the portion corresponding to the lead-out wire 344 relatively decreases in the tip portion of the lead-out wire 344 in the extending direction (a −Y axis direction in FIG. 11), it is possible to set the height of the first terminal portion 324T and the height of the second terminal portion 344T to be close to each other, and thus, it is possible to improve the connection reliability with respect to a terminal or the like (not illustrated) which is connected to the first terminal portion 324T and the second terminal portion 344T.

In addition, the lead-out wire 324 of this embodiment has a tapered shape which narrows towards the second conductor layer 34 side. Accordingly, it is possible to improve the mechanical strength of the lead-out wire 324 with respect to a pressing force at the time of pressing the intermediate 7 against the second intaglio 45, compared to a case where the lead-out wire 324 does not have the tapered shape or a case where the lead-out wire 324 has a reversely tapered shape. For this reason, it is possible to suppress the disconnection of the lead-out wire 324 at the time of being manufactured, and to improve the durability of the wiring board 1. In this embodiment, the lead-out wire 344 also has the same tapered shape (a tapered shape which narrows towards a side separated from the first conductor layer 32). Accordingly, it is possible to suppress the disconnection of the second conductor wire 342 by also improving the mechanical strength thereof, and thus, it is possible to further improve the durability of the wiring body 3, the wiring board 1, and the touch sensor 10 including the wiring body 3 and the wiring board 1.

In addition, in the wiring body 3 of this embodiment, a relative relationship of the surface roughness (that is, a roughness parameter blocking a waviness component) between the lower surface 328 of the lead-out wire 324 (the first terminal portion 324T) and a surface except for the lower surface 328 (the surface including the upper surface 329 and the side portion 327), in the sectional surface of the lead-out wire 324 in the width direction, is also noticed, and in this embodiment, the surface roughness of the lower surface (the first adhesive surface) 328 of the lead-out wire 324 (first terminal portion 324T) in FIG. 8 is rougher than the surface roughness of the upper surface 329 of the lead-out wire 324 (the first terminal portion 324T) in FIG. 8. Accordingly, the contact area between the lead-out wire 324 (the first terminal portion 324T) and the adhesive layer 31 increases, and thus, it is possible to rigidly fix the lead-out wire 324 (the first terminal portion 324T) to the adhesive layer 31. For this reason, it is possible to further improve the durability of the wiring body 3, the wiring board 1, and the touch sensor 10 including the wiring body 3 and the wiring board 1. In addition, it is possible to suppress the diffuse reflection of light which is collectively incident from the outside. In particular, in a case where the width of the lead-out wire 324 (the first terminal portion 324T) is 1 μm to 5 μm, a relative relationship of the surface roughness between the lower surface 328 and the upper surface 329 satisfies the relationship described above, and thus, it is possible to remarkably exhibit an effect of enabling the diffuse reflection of the light which is incident from the outside to be suppressed while allowing the adhesive layer 31 to rigidly adhere to the lead-out wire 324 (the first terminal portion 324T).

In addition, in this embodiment, similarly, the surface roughness of the lower surface 348 of the lead-out wire 344 (the second terminal portion 344T) in FIG. 8 is rougher than the surface roughness of the upper surface 349 of the lead-out wire 344 (the second terminal portion 344T) in FIG. 8, and thus, it is possible to further improve the durability of the wiring body 3, the wiring board 1, and the touch sensor 10 including the wiring body 3 and the wiring board 1. In addition, it is possible to suppress the diffuse reflection of the light which is collectively incident from the outside. In particular, in a case where the width of the lead-out wire 344 (the second terminal portion 344T) is 1 μm to 5 μm, a relative relationship of the surface roughness between the lower surface 348 and the upper surface 349 satisfies the relationship described above, and thus, it is possible to remarkably exhibit an effect of enabling the diffuse reflection of the light which is incident from the outside to be suppressed while allowing the resin layer 33 to rigidly adhere to the lead-out wire 344 (the second terminal portion 344T).

In addition, in this embodiment, the side portion 327 extends to be substantially coincident with the virtual straight line passing through the first portion 3271 and the second portion 3272. In this case, in the sectional surface of the lead-out wire 324 (the first terminal portion 324T) in the width direction, the side portion 327 does not have a shape recessed to the inside from the virtual straight line passing through the first portion 3271 and the second portion 3272 (a shape in which the bottom of the conductive pattern widens), and thus, the diffuse reflection of the light which is incident from the outside on the wiring body 3 is suppressed. Accordingly, it is possible to further improve the visibility of the wiring body 3.

Similarly, in this embodiment, the side portion 347 extends to be substantially coincident with the virtual straight line passing through the first portion 3471 and the second portion 3472. In this case, in the sectional surface of the lead-out wire 344 (the second terminal portion 344T) in the width direction, the side portion 347 does not have a shape recessed to the inside from the virtual straight line passing through the first portion 3471 and the second portion 3472 (a shape in which the bottom of the conductive pattern widens), and thus, the diffuse reflection of the light which is incident from the outside on the wiring body 3 is suppressed. Accordingly, it is possible to further improve the visibility of the wiring body 3.

In addition, in this embodiment, the surface roughness Ra of the lower surface 328 is relatively rougher than the surface roughness Ra of a surface except for the lower surface 328 (the surface including the upper surface 329 and the side portion 323), and thus, the diffuse reflectance of the wiring body 3 on the side of the surface except for the lower surface 328 is relatively smaller than the diffuse reflectance of the wiring body 3 on the side of the lower surface 328. Here, in a case where the diffuse reflectance of the wiring body 3 decreases, it is possible to prevent the lead-out wire 324 from being reflected to be white, and to suppress a contrast decrease in a region where the lead-out wire 324 can be viewed. Thus, it is possible to further improve the visibility of the wiring body 3 of this embodiment.

Similarly, in this embodiment, the surface roughness Ra of the lower surface 348 is relatively rougher than the surface roughness Ra of a surface except for the lower surface 348 (the surface including the upper surface 349 and the side portion 343), and thus, the diffuse reflectance of the wiring body 3 on the other surface side is relatively smaller than the diffuse reflectance of the wiring body 3 on the lower surface 348 side. Here, in a case where the diffuse reflectance of the wiring body 3 decreases, it is possible to prevent the lead-out wire 344 from being reflected to be white, and to suppress a contrast decrease in a region where the lead-out wire 344 can be viewed. Thus, it is possible to further improve the visibility of the wiring body 3 of this embodiment.

In addition, in this embodiment, the first conductor wires 321 and 322 or the second conductor wires 341 and 342 also have the same shape as that of the lead-out wire 324 and the lead-out wire 344, and thus, the first conductor wires 321 and 322 and the second conductor wires 341 and 342 are also capable of exhibiting the same function and the same effect as the function and the effect of the lead-out wire 324 and the lead-out wire 344 described above. For this reason, it is possible to further improve the durability of the wiring body 3, the wiring board 1, and the touch sensor 10 including the wiring body 3 and the wiring board 1, and to further improve the visibility thereof.

Furthermore, in this embodiment, in the planar view, the lead-out wire 344 is disposed on both sides of the lead-out wire 324 at predetermined intervals, but it not particularly limited thereto. For example, even though it is not particularly illustrated, in the planar view, the lead-out wire 324 may be disposed on both sides of the lead-out wire 344 at predetermined intervals.

<<Second Embodiment>>

Figure 14:
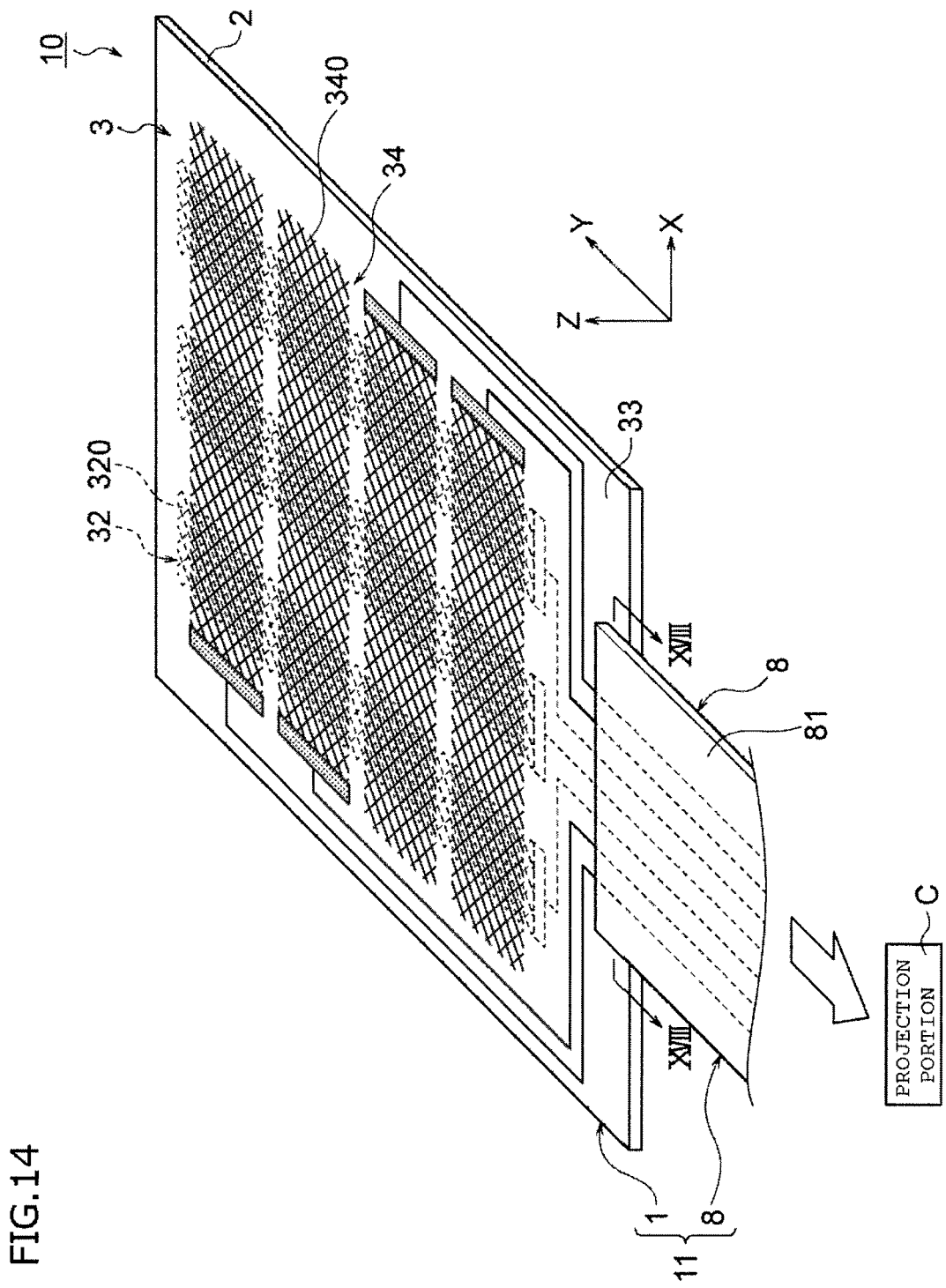
FIG. 14 is a perspective view illustrating a touch sensor of a second embodiment of the invention.
Figure 15:
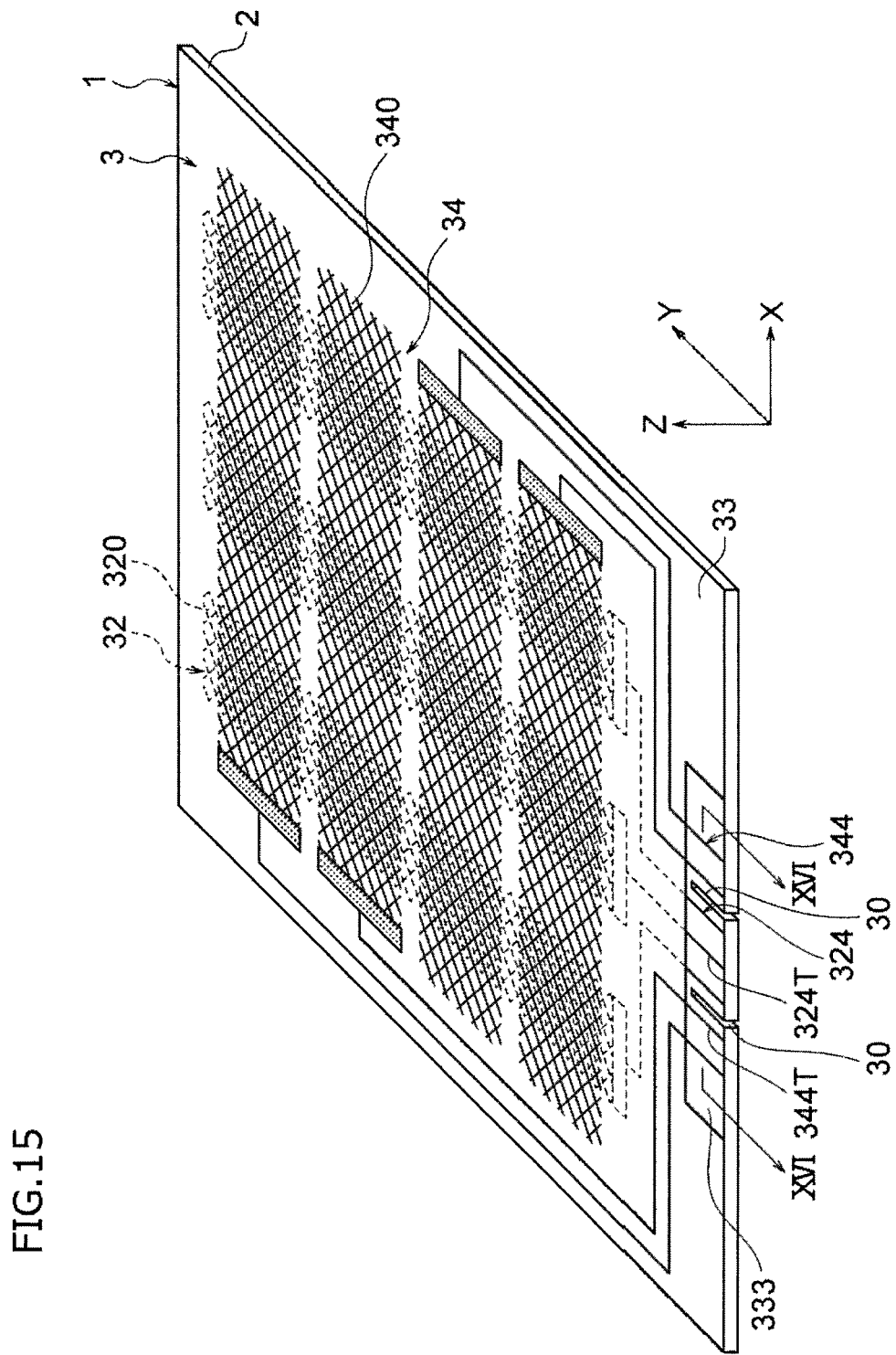
FIG. 15 is a perspective view illustrating a wiring board of the second embodiment of the invention.
Figure 16:
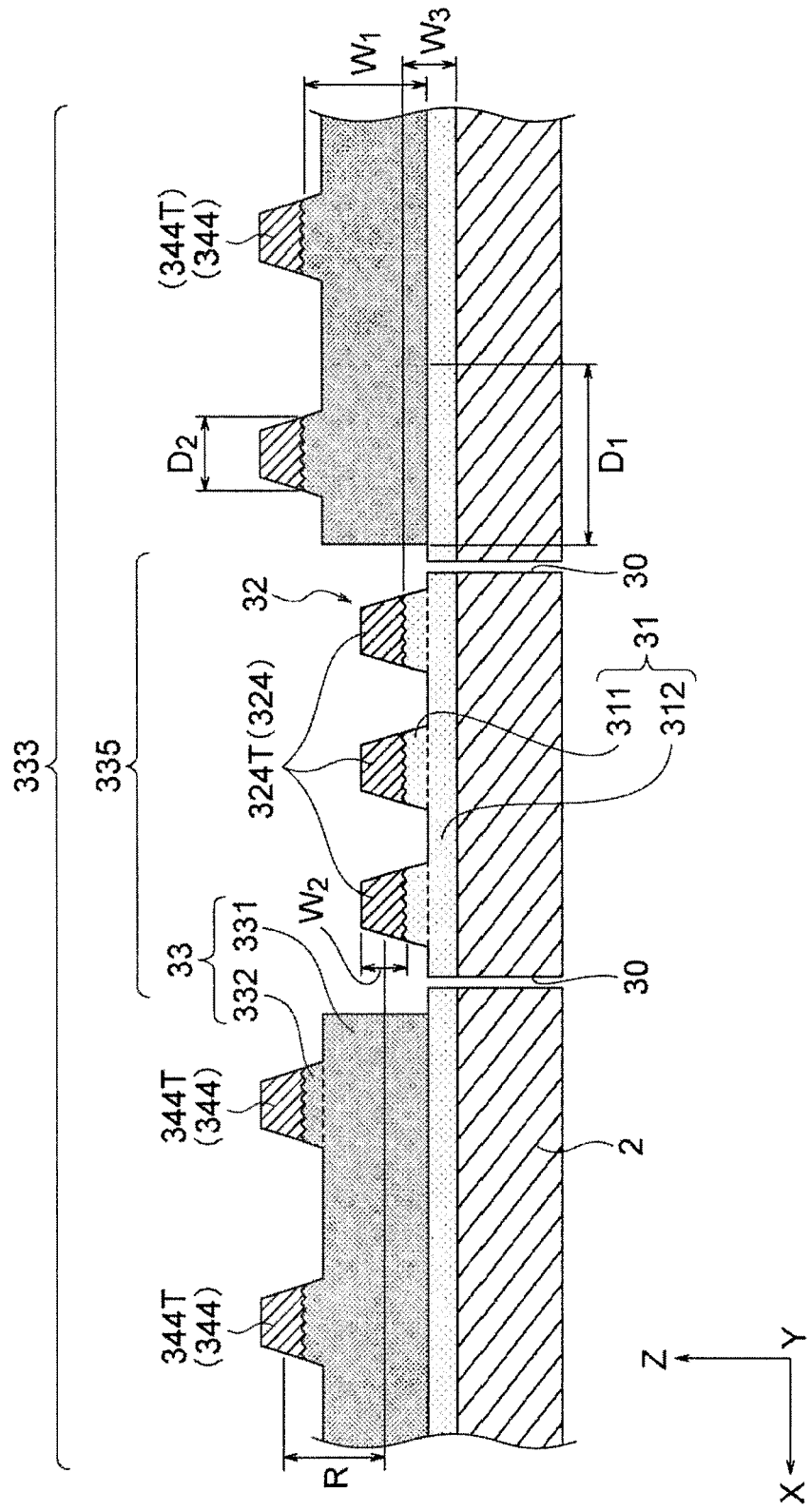
FIG. 16 is a sectional view taken along line XVI-XVI of FIG. 15.
Figure 17:
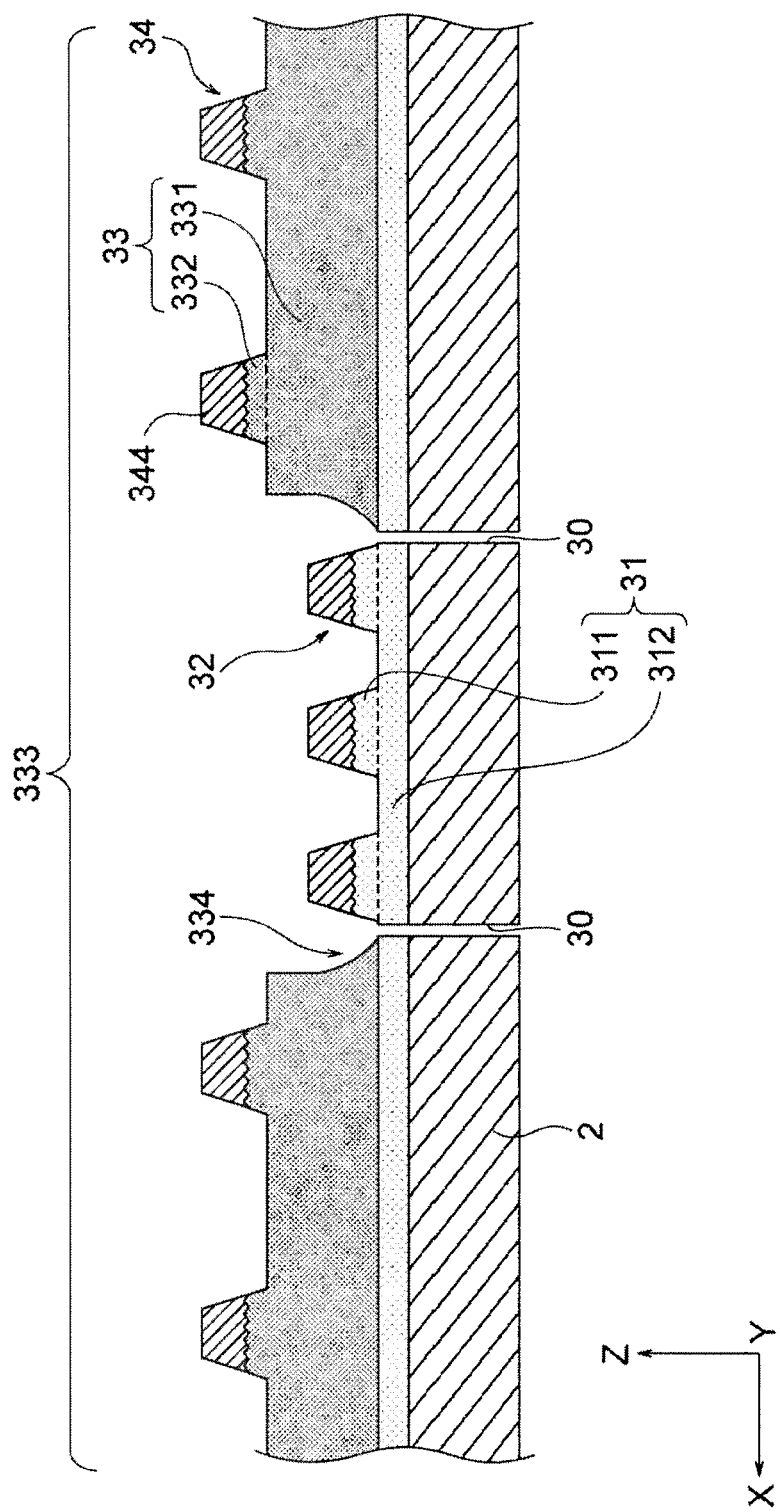
FIG. 17 is a sectional view illustrating a first modification example of a second resin layer of the second embodiment of the invention.
Figure 18:
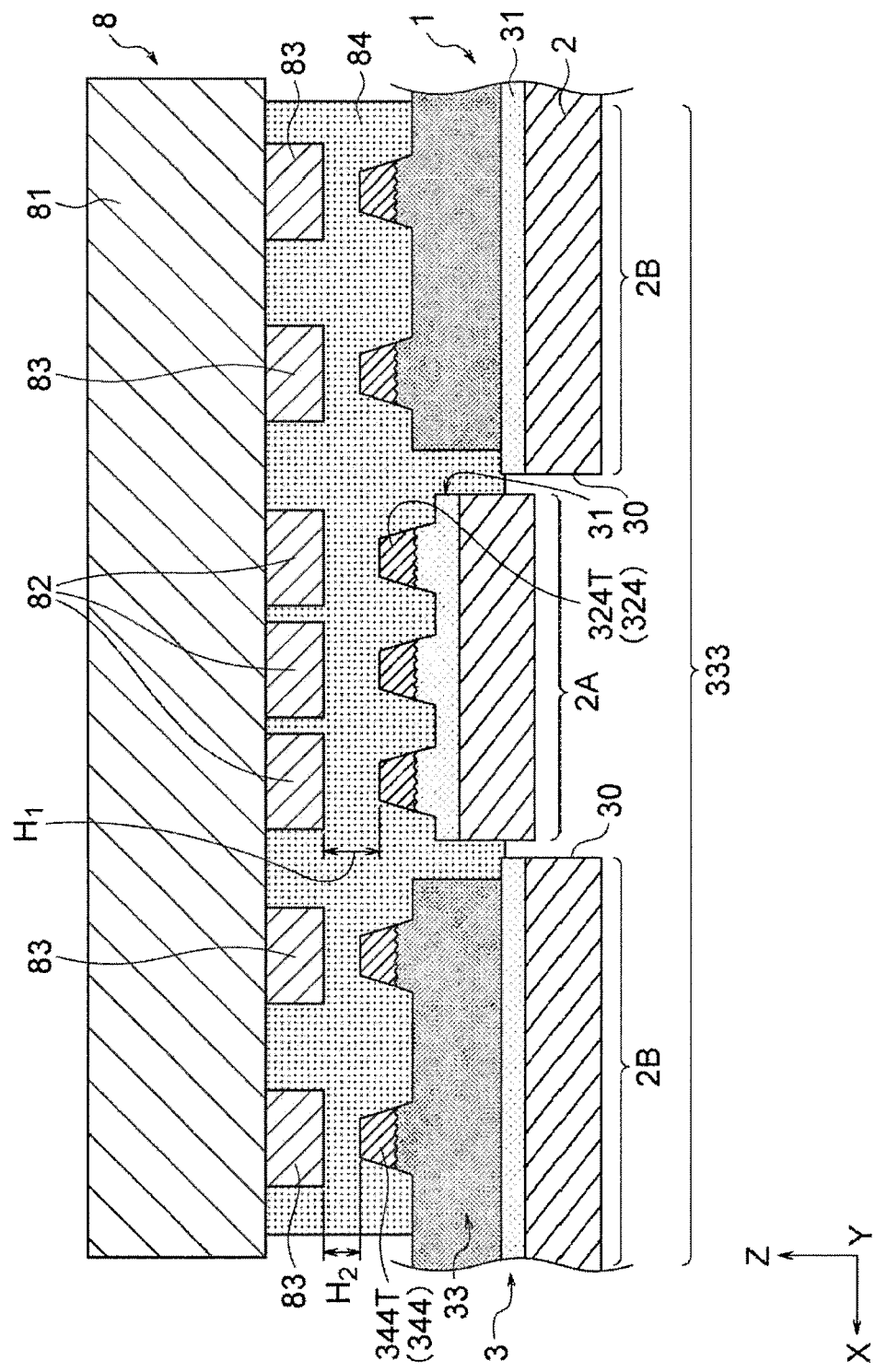
FIG. 18 is a sectional view taken along line XVIII-XVIII of FIG. 14.

FIG. 14 is a perspective view illustrating a touch sensor of a second embodiment of the invention, FIG. 15 is a perspective view illustrating a wiring board of the second embodiment of the invention, FIG. 16 is a sectional view taken along line XVI-XVI of FIG. 15, FIG. 17 is a sectional view illustrating a first modification example of a second resin layer of the second embodiment of the invention, and FIG. 18 is a sectional view taken along line XVIII-XVIII of FIG. 14.

In this embodiment, an example of a wiring structure 11 including the wiring board 1 described above will be described with reference to FIG. 14 to FIG. 18.

Furthermore, a fundamental configuration of the wiring board 1 (the wiring body 3) of the wiring structure 11 of this embodiment is identical to that of the first embodiment. Hereinafter, the configuration of the wiring structure 11 will be described as the second embodiment, but in the wiring board 1 (the wiring body 3), only a difference from the first embodiment will be described, and the description of portions having the same configurations as those of the first embodiment will be omitted by applying the same reference numerals thereto.

As illustrated in FIG. 14, the wiring structure 11 of this embodiment is used in the touch sensor 10 as with the first embodiment, and includes the wiring board 1, and a connection wiring board 8 electrically connected to the wiring body 3 of the wiring board 1.

As illustrated in FIG. 15 and FIG. 16, in the wiring board 1 of this embodiment, a slit 30 is provided in the substrate 2 and the adhesive layer 31. The slit 30 is provided to divide the first terminal portion 324T from the second terminal portion 344T in a region (a resin layer non-forming portion 335) on the adhesive layer 31 on which the resin layer 33 is not formed, and is formed to the vicinity of an end portion of the terminal region 333. The slit 30 of this embodiment is linearly formed along a Y axis direction in FIG. 15, but is not particularly limited thereto, and may be formed in the shape of a curve.

Furthermore, as illustrated in FIG. 17, the thin portion 334 which gradually becomes thin towards the first terminal portion 324T side may be formed on the side surface of the resin layer 33, which faces the resin layer non-forming portion 335. In this case, when the first terminal portion 324T and the second terminal portion 344T are connected to the connection wiring board 8, it is possible to prevent air bubbles from entering between the connection wiring board 8, and the first terminal portion 324T and the second terminal portion 344T. In addition, the step between the first terminal portion 324T and the second terminal portion 344T is reduced due to the existence of the thin portion 334, and thus, it is possible to easily connect the first terminal portion 324T and the second terminal portion 344T to the connection wiring board 8, and to improve the durability of the connection portion. In the shape illustrated in FIG. 17, the slit 30 is formed between the thin portion 334 and the first terminal portion 324T which is closest to the thin portion 334, in a sectional surface perpendicular to the Y axis direction (the extending direction of the first terminal portion 324T).

As illustrated in FIG. 14 and FIG. 18, in the wiring structure 11 of this embodiment, the connection wiring board 8 is attached to the terminal region 333.

The connection wiring board 8 has a function of connecting the driving circuit C (refer to FIG. 14) to the wiring board 1, and includes a connection substrate 81, and a first connection terminal 82 and a second connection terminal 83 which are respectively disposed on the connection substrate 81.

The connection substrate 81, for example, is configured of a film formed of polyethylene terephthalate (PET), polyethylene naphthalate (PEN), a polyimide resin (PI), a polyether imide resin (PEI), and the like. As illustrated in FIG. 18, the first connection terminal 82 is disposed to face the first terminal portion 324T, and the second connection terminal 83 is disposed to face the second terminal portion 344T.

The connection wiring board 8 faces the wiring board 1 through the anisotropic conductive adhesive agent 84, and the connection wiring board 8 and the wiring board 1 are fixed to each other. An anisotropic conductive film (ACF) manufactured by Dexerials Corporation, and the like can be exemplified as such an anisotropic conductive adhesive agent 84. Accordingly, the first terminal portion 324T and the first connection terminal 82 are electrically connected to each other, and the second terminal portion 344T and the second connection terminal 83 are electrically connected to each other. Furthermore, a method of connecting the first terminal portion 324T to the first connection terminal 82 and a method of connecting the second terminal portion 344T to the second connection terminal 83 are not particularly limited to the above description, and the connection may be performed by using solder or the like.

As illustrated in FIG. 18, in this embodiment, in the wiring board 1, a portion 2A in which the first terminal portion 324T is disposed is relatively shifted to the connection wiring board 8 side (a +Z axis direction side in FIG. 18) with respect to a portion 2B in which the second terminal portion 344T is disposed. That is, the first terminal portion 324T and the second terminal portion 344T are shifted from each other along the thickness direction of the adhesive layer 31. Accordingly, the adhesive layer 31 corresponding to the first terminal portion 324T is close to the connection substrate 81 side, compared to the adhesive layer 31 corresponding to the second terminal portion 344T. Furthermore, it is preferable that a distance $H_1$ between the first terminal portion 324T and the first connection terminal 82 and a distance $H_2$ between the second terminal portion 344T and the second connection terminal 83 are approximately identical to each other ($H_1 \cong H_2$).

Next, a manufacturing method of the wiring structure 11 of this embodiment will be described. FIG. 19(A) to FIG. 19(L) are sectional views for describing the manufacturing method of the wiring structure of the second embodiment of the invention. Furthermore, in the example of FIG. 19(A) to FIG. 19(L), a case where the second terminal portion 344T is disposed on the outside of each of two terminal portions of the first terminal portion 324T and the first terminal portion 324T is illustrated.

First, the wiring board 1 is obtained by using the same method as the method described in the first embodiment (refer to FIG. 19(A) to FIG. 19(I)). Next, as illustrated in FIG. 19(J), the slit 30 dividing the first terminal portion 324T from the second terminal portion 344T is provided by a laser cutter or the like. Subsequently, the connection wiring board 8 is prepared in which the first connection terminal 82 and the second connection terminal 83 are disposed on the connection substrate 81, and is set in a thermocompression device to face the wiring board 1 through the anisotropic conductive adhesive agent 84 (refer to FIG. 19(K)). At this time, the first terminal portion 324T faces the first connection terminal 82, and the second terminal portion 344T faces the second connection terminal 83.

Next, by using the thermocompression device, a pressure is applied to the wiring board 1 and the connection wiring board 8 while applying heat to the anisotropic conductive adhesive agent 84, and thus, thermocompression is performed. At this time, as illustrated in FIG. 19(L), in the wiring board 1, a stronger pressure is applied to the portion 2A in which the first terminal portion 324T is disposed than the portion 2B in which the second terminal portion 344T is disposed, and the adhesive layer 31 corresponding to the first terminal portion 324T is set to be closer to the connection substrate 81 side, compared to the adhesive layer 31 corresponding to the second terminal portion 344T. By such thermocompression, the wiring board 1 and the connection wiring board 8 are fixed to each other, and the first terminal portion 324T and the second terminal portion 344T are electrically connected to the first connection terminal 82 and the second connection terminal 83, respectively, and thus, the wiring structure 11 is obtained.

Next, the function of the wiring structure 11 and the touch sensor 10 of this embodiment will be described.

The wiring structure 11 of this embodiment includes the wiring body 3, and thus, is capable of obtaining the same function and the same effect as the function and the effect of the wiring body 3 described in the first embodiment.

In addition, in the related art, a first conductive layer is formed on a transparent film, and then, a transparent polymer layer is disposed thereon, and a second conductive layer is formed on the transparent polymer layer, and thus, a conductive structure formed of two conductive layers is formed. In such a conductive structure, in a case wiring for connecting a conductive layer to an external wiring board or the like is provided, there is a problem in that the conductive layer is formed of two layers, and thus, wiring extractability deteriorates.

In contrast, in the wiring structure 11 (the wiring body 3) of this embodiment, the first conductor layer 32 is formed on the adhesive layer 31, and the second conductor layer 34 is formed on the resin layer 33. Then, the first terminal portion 324T of the first conductor layer 32 and the second terminal portion 344T of the second conductor layer 34 are shifted from each other along the thickness direction of the adhesive layer 31. In addition, the adhesive layer 31 and the substrate 2 include the slit 30 dividing the first terminal portion 324T from the second terminal portion 344T.

Accordingly, when the wiring board 1 is connected to the connection wiring board 8, it is possible to set the height of the first terminal portion 324T and the height of the second terminal portion 344T to be close to each other (refer to FIG. 18), and thus, it is possible to easily align the height of the first terminal portion 324T and the height of the second terminal portion 344T, and to improve the wiring extractability. In addition, a distance between the first terminal portion 324T and the first connection terminal 82 and a distance between the second terminal portion 344T and the second connection terminal 83 are set to be close to each other, and thus, it is possible to improve the connection properties between the wiring body 3 and the connection wiring board 8. Furthermore, in a case where the distance between the first terminal portion 324T and the first connection terminal 82 and the distance between the second terminal portion 344T and the second connection terminal 83 are approximately identical to each other, it is possible to further improve the connection properties between the wiring body 3 and the connection wiring board 8.

Furthermore, in this embodiment, the slit is provided in the wiring board 1 side, but is not particularly limited thereto. For example, as illustrated in FIG. 20(A) and FIG. 20(B), the slit 30 may be omitted from the wiring board 1, and the slit 301 may be provided in the connection wiring board 8. The slit 301 is provided to divide the first connection terminal 82 from the second connection terminal 83. As illustrated in FIG. 20(A), when the wiring structure is manufactured, the connection wiring board 8 and the wiring board 1, in which the slit 301 is provided, are set to face to each other through the anisotropic conductive adhesive agent 84, and then, the connection wiring board 8 and the wiring board 1 are fixed to each other by the thermocompression.

At this time, in the connection wiring board 8, a portion 8A in which the first connection terminal 82 is received is relatively strongly pressure-bonded to a portion 8B in which the second connection terminal 83 is disposed, and the first connection terminal 82 is set to be closer to the adhesive layer 31 side, compared to the second connection terminal 83. Even in this case, it is possible to exhibit the same effect as that of the embodiment described above. Furthermore, it is preferable that the distance $H_1$ between the first terminal portion 324T and the first connection terminal 82 and the distance $H_2$ between the second terminal portion 344T and the second connection terminal 83 are approximately identical to each other ($H_1 \cong H_2$), and in this case, it is possible to further improve the connection properties between the wiring body 3 and the connection wiring board 8.

Furthermore, the embodiments described above have been described for easily understanding the invention, and are not described for limiting the invention. Therefore, each constituent disclosed in the embodiments described above includes all design changes or equivalents belonging to the technical scope of the invention.

For example, in the embodiments described above, a metal material or a carbon-based material is used as the conductive material configuring the first conductor layer and the second conductor layer, but the conductive material is not particularly limited thereto, and a mixture of the metal material and the carbon-based material may be used as the conductive material. In this case, in the case of describing the first conductor wire 322 as an example, the carbon-based material may be disposed on the first conductor wire 322 on the upper surface 325 side, and the metal material may be disposed on the first conductor wire 322 on the lower surface 326 side. In addition, on the contrary, the metal material may be disposed on the first conductor wire 322 on the upper surface 325 side, and the carbon-based material may be disposed on the first conductor wire 322 on the lower surface 326 side.

In addition, for example, the substrate 2 may be omitted from the wiring board 1 of the embodiments described above. In this case, for example, the wiring body or the wiring board may be configured as a configuration in which a peeling sheet is disposed on the lower surface of the adhesive layer 31, and the peeling sheet is peeled off at the time of mounting the adhesive layer 31, and the adhesive layer 31 adheres to and is mounted on a mounting target (a film, surface glass, a polarizing plate, a display, and the like). Furthermore, in such a configuration, the mounting target corresponds to an example of the support of the invention. In addition, the wiring body or the wiring board may be configured as a configuration in which a resin portion covering the second conductor layer 34 is disposed, and the second conductor layer 34 adheres to and is mounted on the mounting target described above through the resin portion.

In addition, for example, the first electrode pattern of the first conductor layer 32 and the second electrode pattern of the second conductor layer 34 may be configured as illustrated in FIG. 21.

In an example of FIG. 21, a first electrode pattern 320B is configured of rectangular portions 91, and a coupling portion 92 coupling the rectangular portions 91 together. In the rectangular portions 91, diagonal lines are arranged side by side in a Y axis direction approximately at regular intervals along the Y axis direction in FIG. 21, and the coupling portion 92 connects corner portions of the adjacent rectangular portions 91 to each other. The rectangular portion 91 and the coupling portion 92 have a mesh-like shape configured of conductor wires.

A second electrode pattern 340B is also configured of rectangular portions 93, and a coupling portion 94 coupling the rectangular portions 93 together. In the rectangular portions 93, diagonal lines are arranged side by side in an X axis direction approximately at regular intervals along the X axis direction in FIG. 21, and the coupling portion 94 connects corner portions of the adjacent rectangular portions 93 to each other. The rectangular portion 93 and the coupling portion 94 also have a mesh-like shape configured of conductor wires. The first electrode patterns 320B are arranged approximately at regular intervals along the X axis direction in FIG. 21, and the second electrode patterns 340B are arranged approximately at regular intervals along the Y axis direction in FIG. 21. Then, the first electrode patterns 320B and the second electrode patterns 3403 intersect with each other in the coupling portions 92 and 94.

In this example, it is possible to exhibit the same effect as the effect described in the embodiments described above.

In addition, in the embodiments described above, the wiring body has been described as being used in the touch sensor, but the application of the wiring body is not particularly limited thereto. For example, the wiring body is energized and is allowed to produce fever by resistive heating or the like, and thus, the wiring body may be used as a heater. In this case, it is preferable that a carbon-based material having a comparatively high electric resistance value is used as the conductive material configuring the conductor layer. In addition, a part of a conductive portion of the wiring body is grounded, and thus, the wiring body may be used as an electromagnetic shield. In addition, the wiring body may be used as an antenna.

EXPLANATIONS OF LETTERS OR NUMERALS

1: wiring board
2: substrate
21: main surface
11,11B: wiring structure
3: wiring body
30: slit
31: adhesive layer (first resin layer)
311: support portion (first protrusion)
312: smooth portion
32: first conductor layer
320, 320B: first electrode pattern (first electrode portion)
321, 322: first conductor wire
323: side portion
3231: first portion
3232: second portion
3233: flat portion
324: lead-out wire
324T: first terminal portion
327: side portion
3271: first portion
3272: second portion
3273: flat portion
328: lower surface
329: upper surface
3291: flat portion
325: upper surface
3251: flat portion
326: lower surface
M: conductive material
B: binder resin
33: resin layer (second resin layer)
331: main portion
332: protrusion (second protrusion)
334: thin portion
335: resin layer non-forming portion
34: second conductor layer
340, 340B: second electrode pattern (second electrode portion)
341, 342: second conductor wire
343: side portion
3431: first portion
3432: second portion
3433: flat portion
344: lead-out wire
344T: second terminal portion
347: side portion
3471: first portion
3472: second portion
3473: flat portion
348: lower surface
349: upper surface
3491: flat portion
345: upper surface
3451: flat portion
346: lower surface
8: connection wiring board
301: slit
81: connection substrate
82: first connection terminal
83: second connection terminal
84: anisotropic conductive adhesive agent
4: first intaglio
41: recessed portion
411: release layer
45: second intaglio
46: recessed portion
461: release layer
5: conductive material
51: concave-convex shape
55: conductive material
6: adhesive material
7: intermediate
71: resin material

The invention claimed is:

1. A wiring body comprising:
a first resin layer;
a first conductor layer including a first terminal portion and disposed on the first resin layer;
a second resin layer covering the first conductor layer except for at least the first terminal portion; and
a second conductor layer including a second terminal portion and directly disposed on the second resin layer, wherein
the first terminal portion and the second terminal portion are exposed to a single surface side of the wiring body,
the single surface side is separated from the first and second resin layers in a thickness direction of the first resin layer,
the first terminal portion and the second terminal portion are shifted from each other along the thickness direction,
the first terminal portion protrudes towards the single surface side, and
when viewed from a direction orthogonal to the thickness direction, at least a part of the first terminal portion overlaps with the second resin layer.

2. The wiring body according to claim 1, wherein
the first conductor layer further includes a mesh-like first electrode portion,
the second conductor layer further includes a mesh-like second electrode portion,
the first electrode portion and the first terminal portion are integrally formed, and
the second electrode portion and the second terminal portion are integrally formed.

3. The wiring body according to claim 1, wherein a maximum thickness of the second resin layer is greater than a maximum thickness of the first resin layer.

4. The wiring body according to claim 1, wherein the second resin layer corresponding to the second terminal portion includes a thin portion gradually becoming thin towards the first terminal portion side.

5. The wiring body according to claim 1, wherein a thickness of the second resin layer corresponding to the second terminal portion on the second terminal portion side in an extending direction of the second conductor layer relatively decreases.

6. The wiring body according to claim 1, wherein
in the first terminal portion, a surface roughness of a first adhesive surface adhering to the first resin layer is rougher than a surface roughness of a surface on a side opposite to the first adhesive surface, and
in the second terminal portion, a surface roughness of a second adhesive surface adhering to the second resin layer is rougher than a surface roughness of a surface on a side opposite to the second adhesive surface.

7. The wiring body according to claim 1, wherein
the first terminal portion includes a tapered shape which narrows towards the side separated from the first resin layer, and
the second terminal portion includes a tapered shape which narrows towards a side separated from the second resin layer.

8. The wiring body according to claim 1, wherein
the first resin layer includes a first protrusion protruding towards the first terminal portion,
the first terminal portion is disposed on the first protrusion,
the second resin layer includes a second protrusion protruding towards the second terminal portion, and
the second terminal portion is disposed on the second protrusion.

9. The wiring body according to claim 1, wherein the first resin layer includes a slit dividing the first terminal portion from the second terminal portion.

10. A wiring structure comprising:
the wiring body according to claim 9; and
a connection wiring board electrically connected to the wiring body, wherein
the connection wiring board includes:
a connection substrate;
a first connection terminal disposed on the connection substrate to face the first terminal portion; and
a second connection terminal disposed on the connection substrate to face the second terminal portion.

11. The wiring structure according to claim 10, wherein the first resin layer corresponding to the first terminal portion is located closer to the connection substrate side with respect to the first resin layer corresponding to the second terminal portion.

12. A wiring structure comprising:
the wiring body according to claim 1; and
a connection wiring board electrically connected to the wiring body, wherein
the connection wiring board includes:
a connection substrate;
a first connection terminal disposed on the connection substrate to face the first terminal portion; and
a second connection terminal disposed on the connection substrate to face the second terminal portion, and
the connection substrate includes a slit dividing the first connection terminal from the second connection terminal.

13. The wiring structure according to claim 12, wherein the first connection terminal is located closer to the first resin layer side with respect to the second connection terminal.

14. A wiring board comprising:
the wiring body according to claim 1; and
a support that supports the wiring body.

15. A touch sensor comprising:
the wiring board according to claim 14.

* * * * *